US007107676B2

(12) United States Patent
Fridrich

(10) Patent No.: US 7,107,676 B2

(45) Date of Patent: Sep. 19, 2006

(54) ONE PIECE FOLIATED LEADS FOR SEALING IN LIGHT SOURCES

(76) Inventor: Elmer G. Fridrich, 9933 Wilson Mills Rd., Munson Township, OH (US) 44024

(*) Notice: Subject to any disclaimer, the term of this patent is extended or adjusted under 35 U.S.C. 154(b) by 496 days.

(21) Appl. No.: 10/702,155

(22) Filed: Nov. 5, 2003

(65) Prior Publication Data

US 2005/0092051 A1 May 5, 2005

(51) Int. Cl.

*H01R 43/04* (2006.01)
*H05K 5/06* (2006.01)
*B21C 1/00* (2006.01)
*B21C 23/08* (2006.01)
*B21F 1/00* (2006.01)

(52) U.S. Cl. ........................ 29/882; 29/33 F; 29/33 M; 29/34 D; 29/876; 72/376; 174/17.05; 174/17.07; 174/50.61; 174/50.64; 205/650; 205/651; 205/658; 205/664; 313/623; 445/26

(58) Field of Classification Search .................. 29/874, 29/882, 876–879, 885, 34 D, 33 F, 33 M; 72/76, 376; 174/17.05, 17.07, 50.64, 50.57, 174/50.58, 50.61; 205/640–686; 313/623, 313/626; 445/26, 29, 69

See application file for complete search history.

(56) References Cited

U.S. PATENT DOCUMENTS

| | | | | |
|---|---|---|---|---|
| 2,667,595 | A * | 1/1954 | Dell et al. | 313/317 |
| 3,571,899 | A * | 3/1971 | Sobieski | 29/412 |
| 3,582,704 | A * | 6/1971 | Fridrich | 313/331 |
| 3,626,236 | A | 12/1971 | Robinson et al. | |
| 3,866,007 | A * | 2/1975 | Shlesinger et al. | 200/283 |
| 3,894,227 | A | 7/1975 | Pitkjaan et al. | |
| 4,254,356 | A * | 3/1981 | Karikas | 313/623 |
| 4,389,201 | A | 6/1983 | Hansler et al. | |
| 4,498,124 | A | 2/1985 | Mayer et al. | |

(Continued)

FOREIGN PATENT DOCUMENTS

| | | |
|---|---|---|
| WO | WO98/14733 | 4/1998 |

OTHER PUBLICATIONS

Harold Wallace (Guest Editor for F.A. Furfari's "History" column), "A Different Kind of Chemistry: A History of Tungsten Halogen Lamps", IEEE Industry Applications Magazine, vol. 7- #6 (Nov./Dec. 2001), IEEE, New York, NY. pp. 10-17 (especially p. 16).

*Primary Examiner*—Peter Vo
*Assistant Examiner*—Livius Radu Cazan
(74) *Attorney, Agent, or Firm*—Dwight A. Stauffer

(57) ABSTRACT

Manufacturing equipment and manufacturing process steps that improve upon prior art processes for the manufacturing of filament tube and arc tube light sources, their components and subassemblies, and lamps employing said light sources. A double ended, tipless filament tube or arc tube light source incorporates a drawn-down tubular body, and one piece foliated leads with spurs for process handling and for spudding into a filament with stretched-out legs. Bugled ends on the body provide a novel cutoff means, facilitate a flush-fill finishing process, and enhance mounting and support of the light sources in lamps. The foliated leads are made from a continuous length of wire in a process including foil hammering and two-bath AC electrochemical etching. Cost-reduced light source and lamp production enables affordable household consumer lamps, even when containing two series-connected halogen filament tubes. Safety benefits ensue from series connection, especially in combination with disclosed body and filament constructions.

16 Claims, 13 Drawing Sheets

U.S. PATENT DOCUMENTS

| | | | | |
|---|---|---|---|---|
| 4,524,302 | A | | 6/1985 | Berlec |
| 4,580,199 | A | | 4/1986 | Wurster et al. |
| 4,719,545 | A | | 1/1988 | Cano |
| 4,727,449 | A | | 2/1988 | Fleck |
| 4,810,932 | A | | 3/1989 | Ahlgren et al. |
| 5,077,645 | A | | 12/1991 | Habinak |
| 5,088,012 | A | | 2/1992 | Burgess |
| 5,138,228 | A | | 8/1992 | Thomas et al. |
| 5,146,134 | A | | 9/1992 | Stadler et al. |
| 5,239,231 | A | | 8/1993 | Grunder |
| 5,440,457 | A | | 8/1995 | Meyer |
| 5,446,336 | A | | 8/1995 | Gleixner et al. |
| 5,527,199 | A | * | 6/1996 | Feder et al. .................. 445/49 |
| 5,896,004 | A | | 4/1999 | Feldman et al. |
| 5,896,007 | A | | 4/1999 | Dobiasch et al. |
| 5,984,490 | A | | 11/1999 | Leen |
| 6,133,676 | A | | 10/2000 | Chen |
| 6,211,616 | B1 | | 4/2001 | Takeuti et al. |
| 6,367,949 | B1 | | 4/2002 | Pederson |

* cited by examiner 10b
6
4
D1
T1
10
12
14
16
10a
5
26
28c
23a
28b
28a
28
8
21a
F1
12b
D2
23b
24
30
32
14'
T2
12a
18
12c
F2
21b

ONE PIECE FOLIATED LEADS FOR SEALING IN LIGHT SOURCES

CROSS-REFERENCE TO RELATED APPLICATIONS

This application relates to U.S. application entitled: LIGHT SOURCE BODIES FOR FILAMENT TUBES AND ARC TUBES application Ser. No. 10/701,808; SPURRED LIGHT SOURCE LEAD WIRE FOR HANDLING AND FOR ASSEMBLING WITH A FILAMENT, application Ser. No. 10/701,832; APPARATUS AND PROCESS FOR FINISHING LIGHT SOURCE FILAMENT TUBES AND ARC TUBES application Ser. No. 10/702,011; MOUNTING LIGHT SOURCE FILAMENT TUBES AND ARC TUBES IN LAMPS application Ser. No. 10/701,950; and TWO-BATH ELECTROLYSIS application Ser. No. 10/701,833; all having filing dates concurrent with that of the present invention.

TECHNICAL FIELD OF THE INVENTION

The present invention relates to electric light sources and their manufacturing processes; and, more particularly, to said light sources in the form of a double ended, tipless filament tube or arc tube.

BACKGROUND OF THE INVENTION

Although a variety of compact light sources are available, those with improved energy efficiency (lamp efficacy) are generally accompanied by proportionally higher manufacturing costs, and therefore by higher purchase prices that often outweigh their perceived benefit to ordinary consumers. For example, U.S. Pat. No. 4,524,302 (Berlec; 1985) discloses a general service incandescent lamp with improved efficiency having an outer envelope and an inner envelope. The inner envelope comprises what is generally known as a halogen lamp: a filament tube of quartz or high temperature glass, hermetically sealed around an incandescent filament, and filled with a relatively high pressure fill-gas including a halogen gas. Among the objects of this invention are to provide a relatively inexpensive general service incandescent lamp, to improve the arc-out resistance of the filament, and to operate at a low voltage so as to extend the life of the lamp while maintaining its wattage and even increasing its efficacy. The reduced voltages relative to a typical 120 volt AC source may be developed, for example, by an electrical transformer.

It is known that low voltage incandescent filaments are more rugged than higher voltage filaments having the same wattage, especially for coiled-wire filaments, because for any given wattage, as the design voltage is decreased the length of wire in the filament decreases, and the diameter of the wire in the filament increases. Two patents exemplify incandescent lamp designs that take advantage of this fact by providing multiple filament tubes that are series-connected within an outer envelope. This reduces the voltage drop across each filament tube without requiring a transformer, however the cost of the inner light source is multiplied by the number of filament tubes provided. U.S. Pat. No. 4,498,124 (Mayer et al.; 1985) discloses a dual halogen bulb rectangular lamp assembly with the two halogen bulbs electrically connected in series for simultaneous bulb energization. The use of two 12-volt halogen bulbs in a 24 volt reflector lamp significantly reduces the possibility of bulb burn-out because the filaments required in 12-volt halogen bulb units are made from shorter, thicker wire that can be coiled much more loosely than the filaments required in 24-volt halogen bulb units. PCT publication WO98/14733 (Katougi et al.; 1998) discloses a light bulb with a plurality of baseless small bulbs series-connected within a globe envelope, for improved earthquake resistance. FIG. 8, for example, shows two double ended filament tubes with wire loop outer leads hanging in parallel arrangement on opposite sides of a central support post.

Another factor that adds to the cost of lamps that incorporate filament tubes (e.g., halogen lamps) is the desire to protect consumers from possible non-passive failure of the filament tube. When an incandescent filament fails at end of life, an electric arc may form between broken ends of the filament. Once started, an arc has very low electrical resistance and will draw as much current as the power supply allows. In arc lamps, the power supply includes some form of ballast to limit the current to a desired amount. Incandescent power supplies do not generally provide much ballasting effect, and rely instead on fuses and/or lamp construction to quench an end-of-life arc before it can produce violent failures that may, for example, rupture the filament-containing envelope(s)—i.e., to "explode". For filament tubes there is a small possibility of non-passive failure due to an arc that overheats the filament tube before the arc can be quenched by a fuse. A common solution is to make the outer lamp envelope out of a thick glass expected to contain a potentially rupturing inner envelope. For example, U.S. Pat. No. 6,133,676 (Chen; 2000) discloses a double enveloped halogen bulb wherein the outer glass envelope has a thickness ranging between 2 mm and 8 mm that is intended to protect a person or an animal contiguous to the bulb from a bodily injury in the event that the tubular halogen bulb explodes. Chen's FIG. 6 shows an embodiment of his outer envelope that is shaped somewhat like a common household light bulb. Obviously, the heavy glass envelope is much more expensive than a standard bulb.

Another solution for containing rupturing filament tubes is taught by related arc lamp art. For lamps that incorporate arc tubes as the light source (e.g., high intensity discharge lamps), non-passive failure is even more of a concern, particularly when the light sources are intended for household use and/or wherever they will not be contained in protective "closed" lighting fixtures. U.S. Pat. No. 5,446,336 (Gleixner et al.; 1995) discloses an explosion-protected high-pressure discharge lamp comprising a protective body surrounding the discharge vessel and located within an outer bulb. The protective body comprises one or two transparent concentric glass sleeves or tubes, at least one of which, preferably, is of quartz glass. The sleeves or tubes have open ends, and they radially surround the discharge vessel, with the open ends being capped by ceramic centering and holding elements which are retained on a lamp holder structure.

A solution for preventing rupturing filament tubes is disclosed by the present inventor in the November/December 2001 issue of *IEEE Industry Applications Magazine* (incorporated by reference herein), wherein a mockup of a 1972 experimental "Gemini lamp" is pictured and described as having "small twin tubes paralleling the central glass stem—these low-pressure, 60-V halogen capsules would not explode . . . . [The] two small 60-V capsules [are] in series . . . " (pg. 16). The pictured mockup has empty glass capsules, and the design of a filament for the capsule is not disclosed. Likewise, the capsule's shape is indeterminate, and no lead wires or sealing foils are present.

FIGS. 2, 4, and 5 of the Berlec '302 patent illustrate some common features of filament tubes. FIG. 2 shows a typical quartz filament tube (22) with 1 mm thick walls that is double ended with an exhaust tube tip on the side of the tube. The tube ends are hermetically sealed by being pinched closed over a thin molybdenum foils (28, 32) that are micro-welded to inner (24*c*, 24*e*) and outer (30, 34) molybdenum lead wires. The inner lead wire may alternatively be tungsten, and is typically welded to the filament, however FIG. 3 illustrates a technique of using the inner lead wire (24*c*, 24*e*) as a spud that is forced into the single coiled end (24*b*, 24*d*) of the filament (24). It is known that this spudding process is difficult to automate given that a blunt wire end must be screwed into the coil in a way that expands the coil diameter. FIG. 4 illustrates a single ended filament tube (36) that is also made out of a high temperature glass other than quartz. In this case, sealing can be accomplished on the round lead wires (38, 40) without needing foils. The illustrated filament tubes (22, 36) are relatively bulky and heavy, and therefore require substantial mounting structures (16, 18, 20, 42, 44, 46, 48) within the outer envelope (12). FIG. 5 illustrates a somewhat smaller filament tube that is only suitable for very low voltage filaments that are consequently short enough to be mounted crosswise in the filament tube.

Several patents assigned to General Electric are indicative of the industry's efforts toward cost-reducing the manufacturing process for both filament tubes and arc tubes, particularly those small enough to be included in smaller lamps. U.S. Pat. No. 4,389,201 (Hansler and Fridrich; 1983), incorporated by reference herein, discloses a method of manufacturing metal halide discharge lamps (arc tubes) on a horizontal glass blowing lathe which is indexed by a turntable through angularly spaced work stations. A length of quartz tubing is formed into a lamp body having an enlarged bulbous midportion defining an arc chamber with tubular necks projecting in opposite directions. FIGS. 9 and 10 show the bulbous midportion (32) being formed by heating (132) while longitudinally gathering the quartz (120) and then blowing it out into a mold (134). Exhausting, flushing, and filling are all accomplished through the length of quartz tubing while it is captured in the lathe, thereby eliminating exhaust tube tips on the side of the arc tube. U.S. Pat. No. 4,810,932 (Ahlgren et al.; 1989), incorporated by reference herein, and other related patents adapt and enhance the '201 patented processes to disclose flush and pump flush processes yielding light sources for both incandescent and metal vapor discharge lamps, particularly tipless double ended filament tubes that are suitable for deposition of a reflective coating on their outer surfaces. FIGS. 1(*a*)–1(*p*) show the flush process implemented in a horizontal lathe. FIG. 1(*d*) shows the filament assembly (12) having a hook-shape section ($12_C$) on one end and a loop extension section ($12_F$) on the other for handling during the manufacturing process. FIG. 1(*f*) shows the filament assembly (12) being self-heated by the passage of electric current while flushing the surrounding tube (10) with an inert gas containing hydrogen. This step in the process removes oxygen contamination from within the confines of the light source body (10) and crystallizes the filament ($12_A$) itself. By applying direct current to the filament positioned so that magnetic forces counter balance the force of gravity on the filament, the crystal structure of the filament may be set so that filament sag is avoided. FIG. 1(*h*) shows the filament tube's midportion ($10_A$) being blown into a mold (30) for precise dimensional control. FIGS. 1(*m*) and 1(*n*) show liquid nitrogen (46) being used to condense a gas filling in the central portion (10*a*) while a torch (20) "shrink seals" the quartz body (10) around the foil sealing members (48, 50). The quartz shrinks without excessive heat because condensing the fill gas reduces the internal pressure of the body below atmospheric pressure. FIGS. 2(*a*)–2(*l*) and 3(*a*)–3(*k*) show the pump flush process implemented vertically for filament tubes and arc tubes, respectively. Minor differences from the horizontal flush process include straight ended lead wires handled by rods (72, 74) in an unspecified manner. Especially in the vertical process, the filament assembly (12) or electrodes (92) are held in place by first and second seal members abutting up against and respectively occupying the first and second neck portions of the tube body, such that bent edges of the foils (e.g., $12_D$, $12_G$) serve as springs to position and maintain the assembly (e.g., 12) on the central axis of the light source body. The seal members ($12_D$, $12_G$, $92_B$, $94_B$) may be of the type described in U.S. Pat. No. 4,254,356 of Karikas, (further described hereinbelow). In preparation for mounting a finished filament tube or arc tube in an outer envelope, ends of the tube are removed by diamond saw cutting or scoring and snapping, thereby exposing a suitable length of the inlead wire extending beyond each end of the tube. As illustrated in FIGS. 6–10, the exposed lead wires are attached to a crossed lamp lead wire on at least one end, and where appropriate, to the base eyelet at the other end to provide a simplified mount structure.

U.S. Pat. No. 4,254,356 (Karikas; 1981), incorporated by reference herein, discloses inleads having a foil portion which is stiffened by reversely folded lateral edges, i.e., bent in opposite directions out of the medial plane. In making a discharge lamp, the electrode-inlead assembly is self-centering as a result of making the overall width of the foil portion and its reversely folded edges exceed slightly the internal diameter of the quartz tube or neck. The inlead assembly (1) comprises a one-piece molybdenum wire portion (2, 3) wherein the central portion (4) is foliated by longitudinal rolling to a thickness of about 0.0009" at the center. Karikas further teaches that the foliated portion (4) may also be produced by cross rolling and by swaging or hammering of the original wire, or may also use a composite foil comprising a cut length of molybdenum foil to one end of which is welded a molybdenum wire and to the other end a tungsten wire. No further details are provided about the proposed hammering process, and the present inventor is not aware of any practical mass production implementations of a foliation-by-hammering process in the lamp-making industry.

It is an overall object of the present invention to significantly reduce the manufacturing cost of high-efficacy light sources, particularly those intended for household use, and more particularly those incorporating incandescent filament tubes contained within a protective outer envelope. Accordingly, it is an object to effectively eliminate the likelihood of non-passive failure for filament tubes in lamps made according to the invention. Accordingly, it is an object to mass-produce inexpensive filament tube envelopes. Accordingly, it is an object to mass-produce inexpensive foil/leadwire assemblies. Accordingly, it is an object to simplify leadwire-to-filament assembly and the handling of said assembly. Accordingly, it is an object to improve manufacturing efficiency for the flush-fill process. Accordingly, it is an object to improve the mounting of filament tubes within an outer envelope. Other subsidiary objects may become evident from the foregoing specification of the present invention.

A further object of the invention is to utilize suitable features of the inventive filament tubes in order to cost-reduce double ended arc tube lamp manufacturing.

BRIEF SUMMARY OF THE INVENTION

According to the invention, a process is disclosed for manufacturing one-piece foliated leads from wire, the foliated lead comprising a foil bookended by a first lead wire and a second lead wire, the process comprising the steps of: providing two opposed hammers, each having a working face centered on an axis; aligning the working faces of the two hammers to be centered on a common axis; positioning a portion of wire between the working faces and orthogonally crossing through the common axis; foliating the wire by hammering the wire between the working faces with a predetermined plurality of blows wherein the motion of hammering is along the common axis; and increasing the magnitude of hammering energy for each succeeding blow.

According to the invention, the magnitude of hammering energy is increased at least linearly for each succeeding blow.

According to the invention, the process further comprises the steps of: tensioning the portion of wire during the foliating step; and keeping the hammers centered on a foliated portion of the wire during the foliating step.

According to the invention, the process further comprises the steps of: supplying a continuous length of wire; conducting the process in sequential cycles, each cycle comprising a step of advancing the wire, followed by a step of processing portions of the wire simultaneously in each of a plurality of stages of the process; advancing the wire by a step distance selected to produce a uniform predetermined foil spacing along the continuous length of wire that is a foliated wire after a hammering stage being the step of hammering the wire; and providing a cutting stage for cutting the foliated leads off an end of the foliated wire. After the hammering stage, the process further comprises providing a straightening stage comprising the step of pulling longitudinally on the first lead wire and the second lead wire in order to tension the foil therebetween such that lateral edges of the foil are curled around a longitudinal line. Preferably the process further comprises the step of heating the foil during the straightening stage. Preferably the process further comprises the step of using an oxidizing heat source such that etching of the foil is included in the heating step.

According to the invention, between the straightening stage and the cutting stage, the process further comprises the step of providing a foil etching stage for etching the foil.

According to the invention, before the cutting stage, the process further comprises the step of providing a foil etching stage for etching the foil. Preferably the foil etching stage further comprises the steps of: firstly passing the foliated wire through electroetching fluid contained in a first etching bath that also contains a first electrode connected to a first pole of an AC power supply; and secondly passing the foliated wire through electroetching fluid contained in a second etching bath that also contains a second electrode connected to a second pole, opposite to the first pole, of the AC power supply. Preferably the foil etching stage further comprises the step of passing the foliated wire through the first etching bath and through the second etching bath by passing through a plurality of seals below a fluid level of the electroetching fluid such that each one of the plurality of seals allows passage of the foliated wire while limiting fluid loss leaking out.

According to the invention, the cutting stage of the process further comprises the step of forming cut ends each having at least one spur protruding laterally beyond a perimeter of the wire. Preferably the cutting stage further comprises the step of cutting the wire with a blunt cutting blade.

According to the invention, the cutting stage of the process further comprises the step of forming at least every other cut end at an angle to the wire of about 45 degrees to about 75 degrees; such that a single spur protrudes laterally beyond the perimeter of the wire.

According to the invention, a lead processing line for manufacturing one-piece foliated leads from wire is disclosed, the foliated lead comprising a foil bookended by a first lead wire and a second lead wire, the lead processing line comprising a hammering stage that comprises: two opposed hammers, each having a working face on a frustum wherein the working face has a slightly convex surface centered on an axis; alignment of the working faces of the two hammers to be centered on a common axis with opposed working faces; positioning of a portion of wire between the working faces and orthogonally crossing through the common axis; and a hammering drive that foliates the wire by hammering the wire between the working faces with a predetermined plurality of blows along the common axis, wherein the magnitude of hammering energy increases for each succeeding blow.

According to the invention, the lead processing line further comprises tensioning devices that tension the portion of wire during the hammering in the hammering stage, and that keep a foliated portion of the wire centered on the hammers during the hammering. Preferably the lead processing line further comprises an arrangement of processing stages comprising: a wire supply that supplies a continuous length of the wire to the hammering stage; a wire advancing device that advances the wire by a step distance selected to produce a uniform predetermined foil spacing along the continuous length of wire that is a foliated wire after the hammering stage; and a cutting stage comprising a cutter for cutting the foliated leads off an end of the foliated wire. Preferably after the hammering stage the lead processing line further comprises a straightening stage comprising a tensioning device for tensioning the foil such that lateral edges of the foil are curled around a longitudinal line. Preferably the lead processing line further comprises heat supplied to the foil during the straightening stage. Preferably the lead processing line further comprises an oxidizer of the foil during the straightening stage.

According to the invention, the lead processing line further comprises a foil etching stage before the cutting stage, preferably between the straightening stage and the cutting stage. Preferably the foil etching stage comprises a two-bath AC electrochemical etching process comprising: a first etching bath containing electroetching fluid and a first electrode connected to a first pole of an AC power supply; a second etching bath containing electroetching fluid and a second electrode connected to a second pole, opposite to the first pole, of the AC power supply; and a conductor of electrical current between the electroetching fluid in the first etching bath and the electroetching fluid in the second etching bath, the conductor being the foliated wire. Preferably the foil etching stage further comprises a plurality of grommet seals mounted within holes below a fluid level of the electroetching fluid, the holes being located in opposed ends of the first etching bath and in opposed ends of the second etching bath, such that the grommet seals allow passage of the foliated wire through the grommet seal while limiting fluid loss leaking out.

According to the invention, the cutting stage of the lead processing line further comprises: opposed cutting blade edges aligned in a central plane of the cutter, each blade edge being defined at a vertex of blade sides that form a blade angle in the range of about 60 degrees to about 120 degrees wherein the blade angle is approximately halved by the central plane; configuration of the cutter such that the opposed cutting blade edges move together within the central plane; and positioning of the cutting blade edges at a predetermined cut angle relative to the wire.

According to the invention, the cutting stage of the lead processing line alternatively further comprises: opposed cutting blades, at least one of which comprises a cutting blade edge defined at a vertex of blade sides wherein the cutting blade edge is blunt; and positioning of the cutting blade edges at a predetermined cut angle relative to the wire.

According to the invention, a one-piece foliated lead for sealing in vitreous material is disclosed, the foliated lead comprising: a length of wire formed into a foil bookended by a first lead wire and a second lead wire; and lateral edges of the foil wherein the lateral edges all curl around a longitudinal line and all curl toward one face of the foil. Preferably the foil is formed by a hammering process followed by a stretch-straightening process.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawing figures. The figures are intended to be illustrative, not limiting. Although the invention is generally described in the context of these preferred embodiments, it should be understood that it is not intended to limit the spirit and scope of the invention to these particular embodiments.

Certain elements in selected ones of the drawings may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Elements of the figures can be numbered such that similar (including identical) elements may be referred to with similar numbers in a single drawing. For example, each of a plurality of elements collectively referred to as 199 may be referred to individually as 199*a*, 199*b*, 199*c*, etc. Alternatively, a single element (e.g., shaft 391) may have multiple parts (e.g., shaft inside end 391*a*, shaft outside end 391*b*). Or, related but modified elements may have the same number but are distinguished by primes. For example, 109, 109', and 109" are three different elements which are similar or related in some way, but have significant modifications, e.g., a tire 109 having a static imbalance versus a different tire 109' of the same design, but having a couple imbalance. Such relationships, if any, between similar elements in the same or different figures will become apparent throughout the specification, including, if applicable, in the claims and abstract.

Figure 1A:
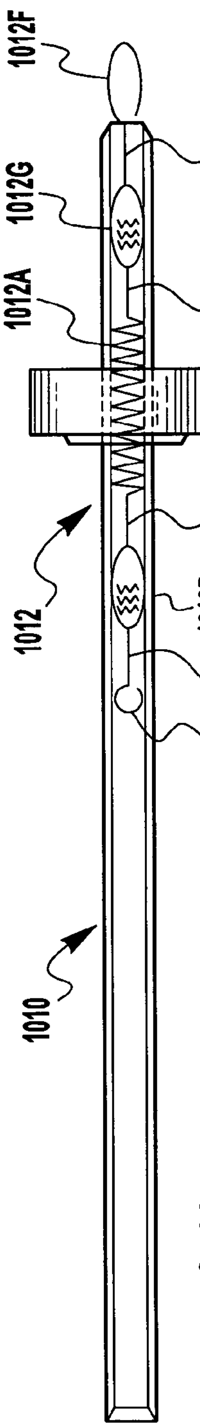
FIG. 1A PRIOR ART
Figure 1B:
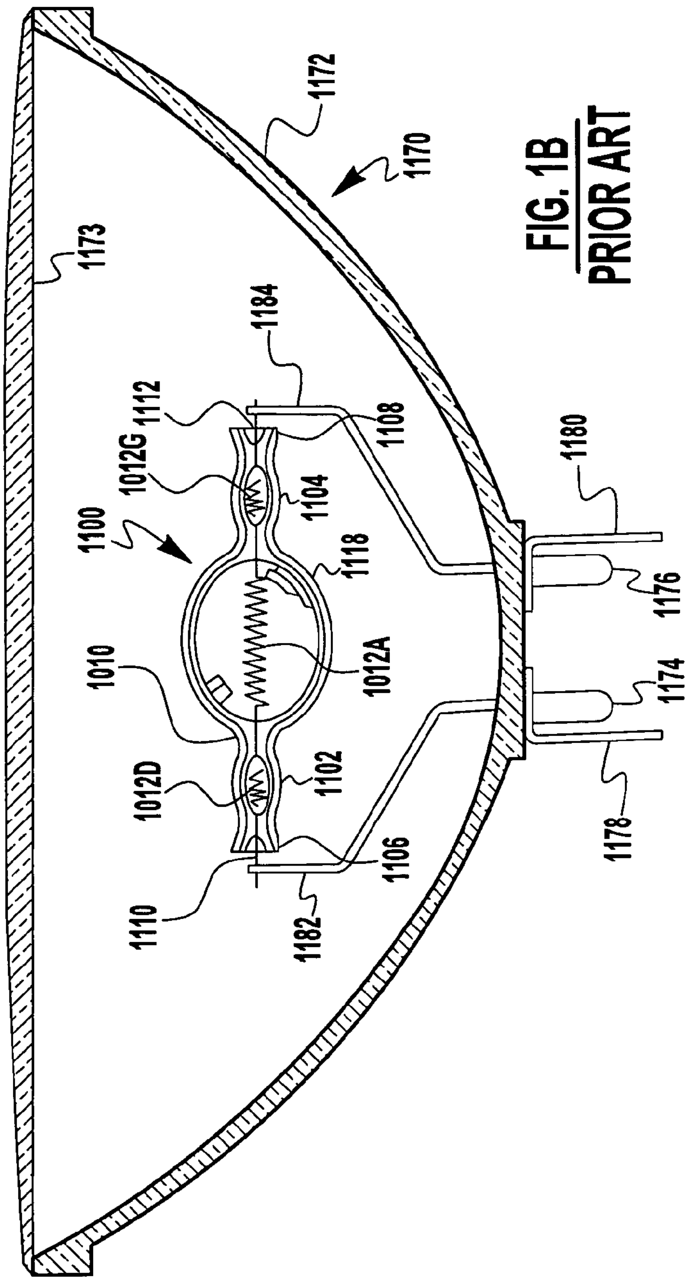
FIG. 1B PRIOR ART
Figures 2A, 2B, 2C:
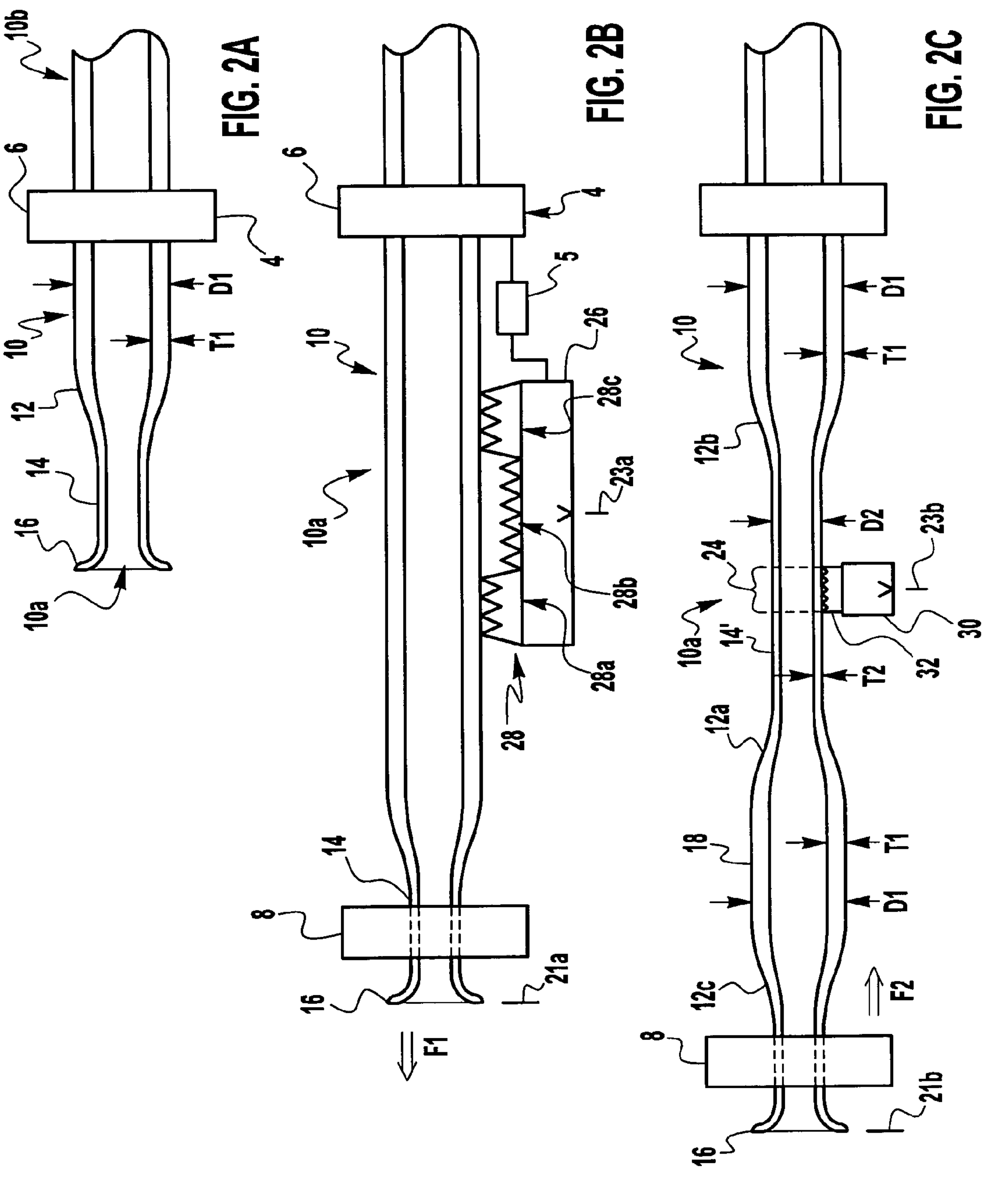
Figures 2D, 2E, 2F:
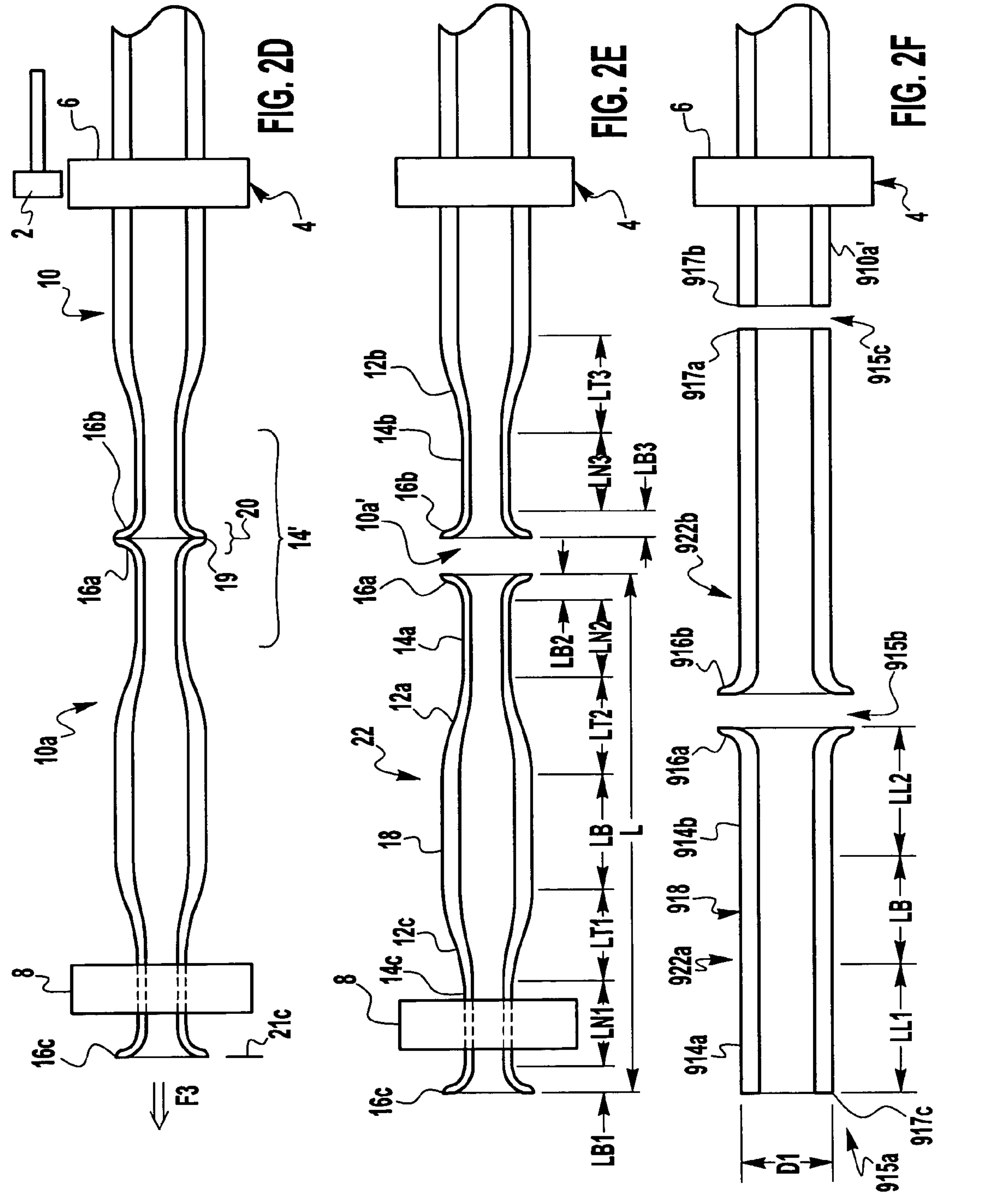
Figure 3:
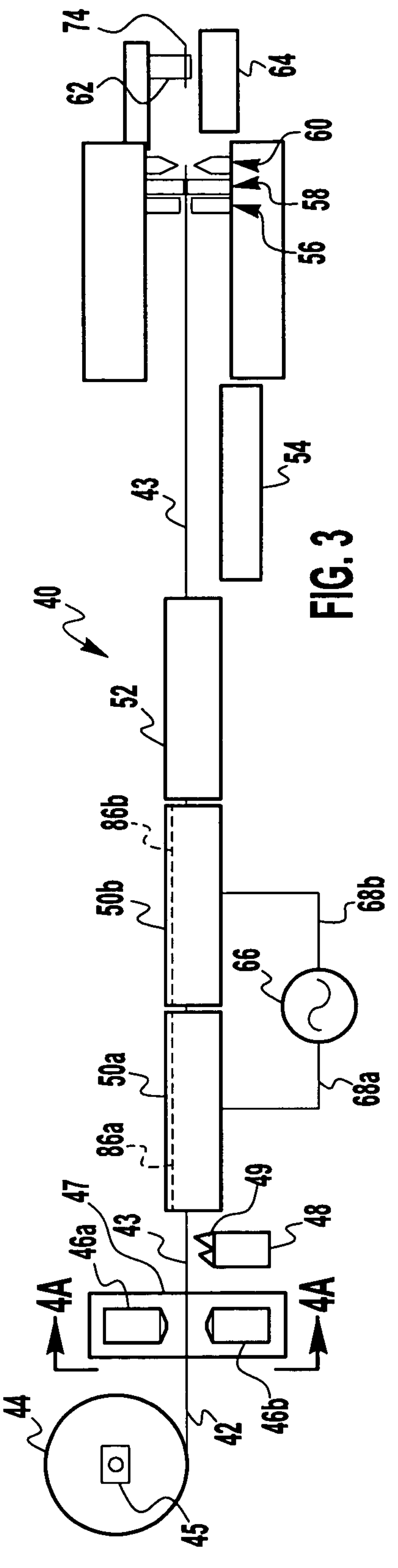
Figure 7A:
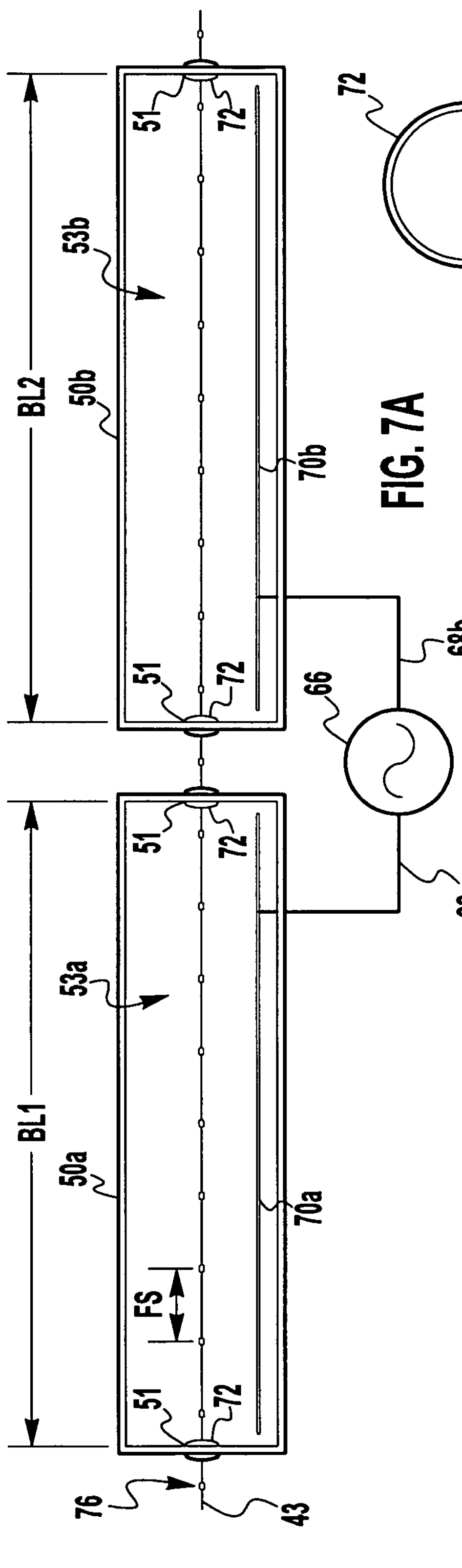
Figure 7B:
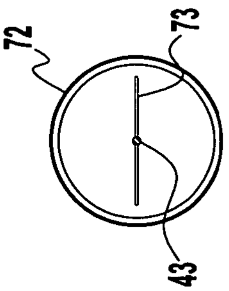
Figure 4A:
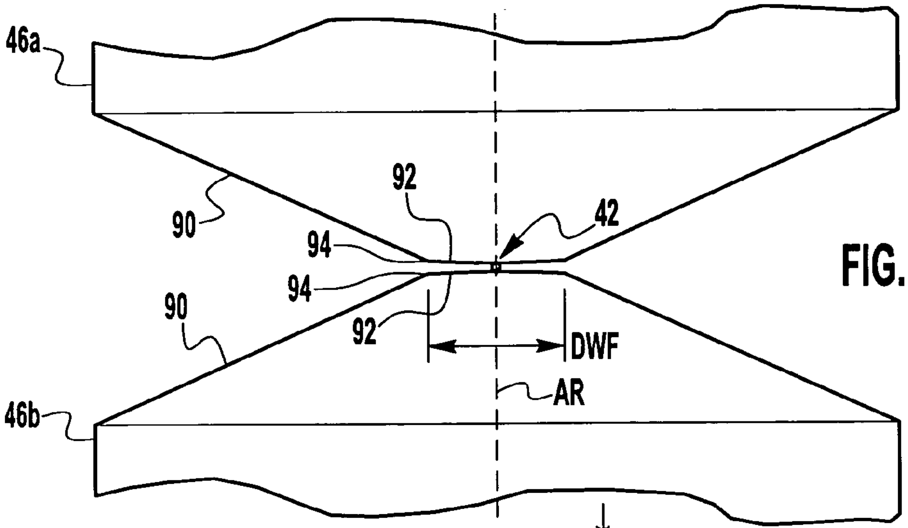
Figure 4B:
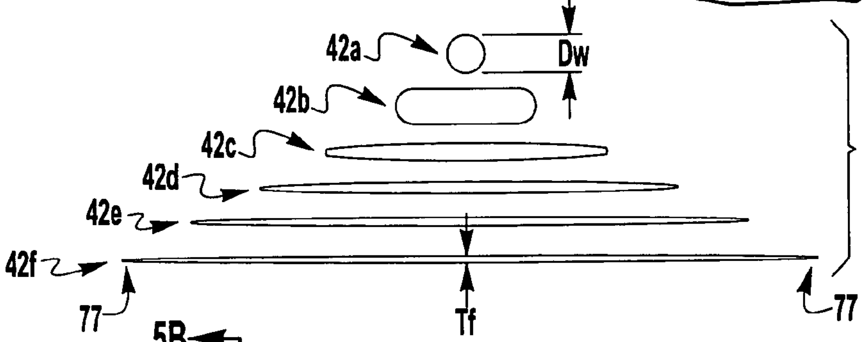
Figure 5A:
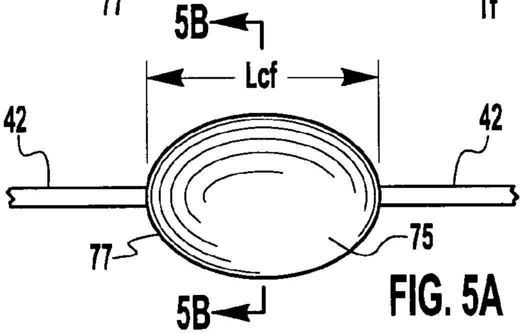
Figure 5B:
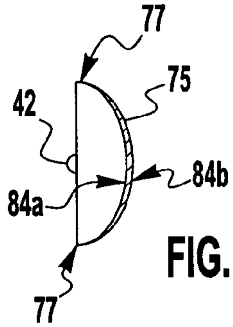
Figure 6A:
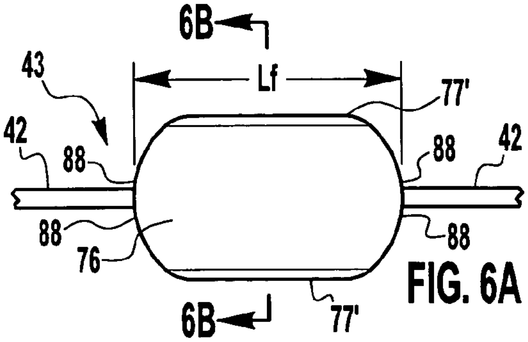
Figure 6B:
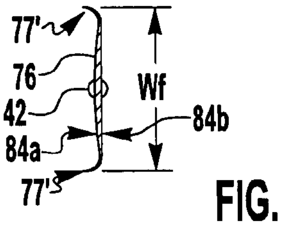
Figure 8A:
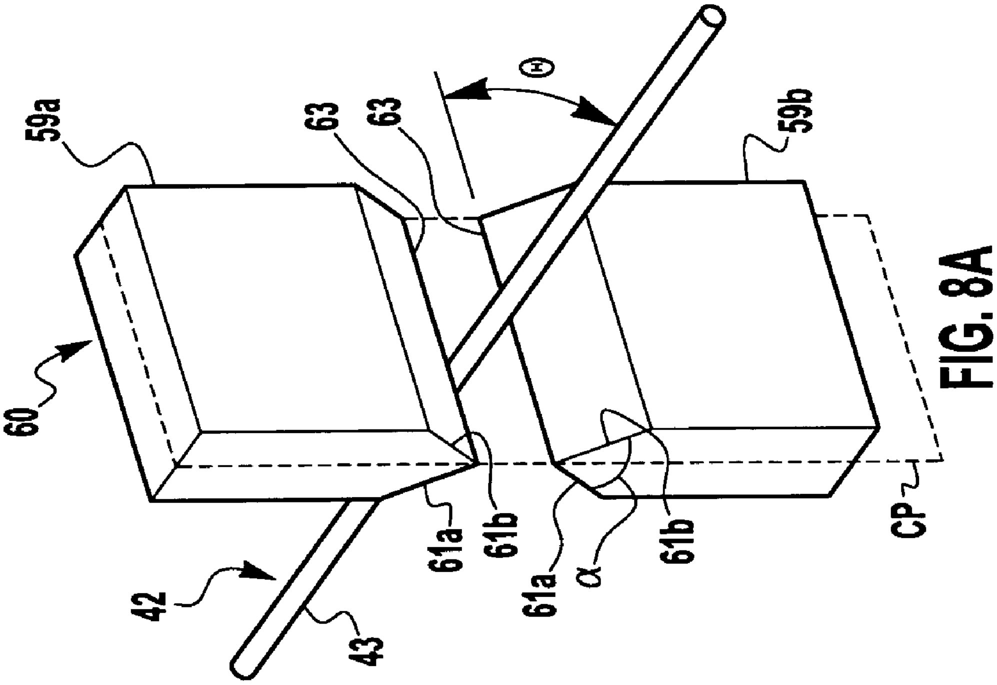
Figure 8B:
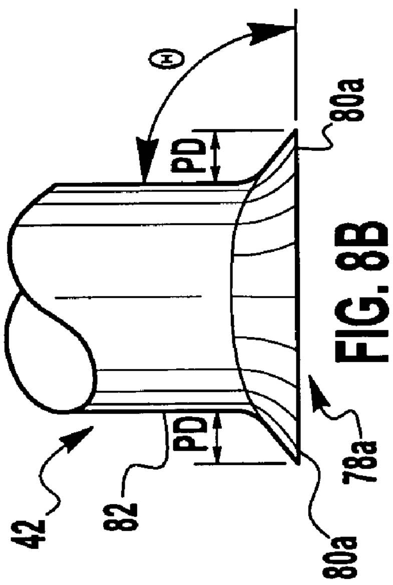
Figure 8C:
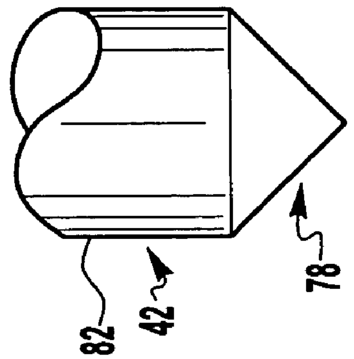
Figure 8D:
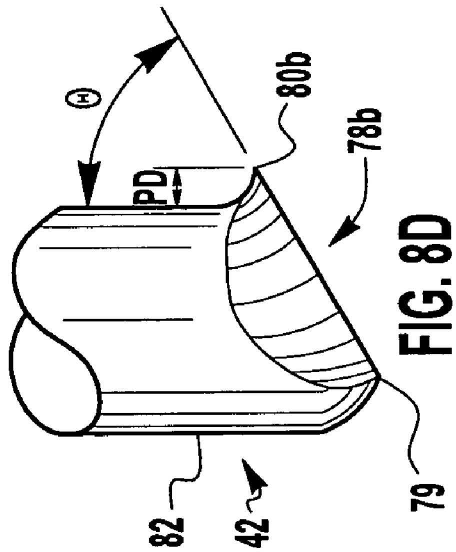
Figure 8E:
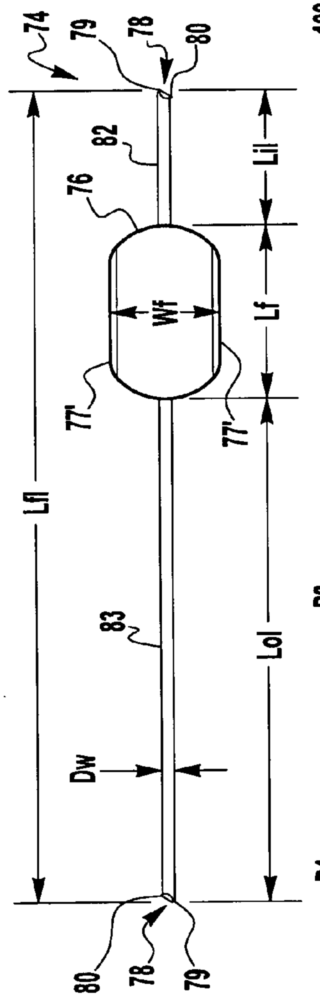
Figure 9A:
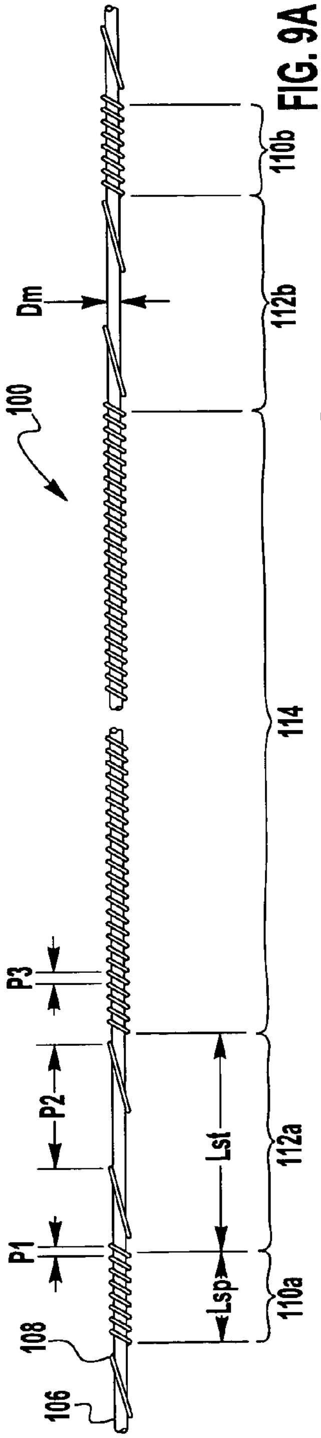
Figure 9B:
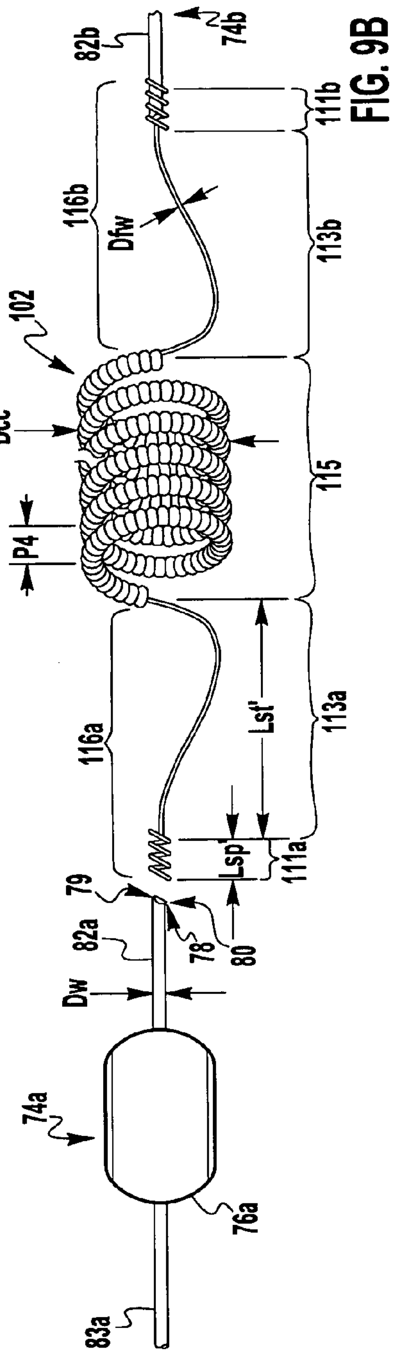
Figure 9C:
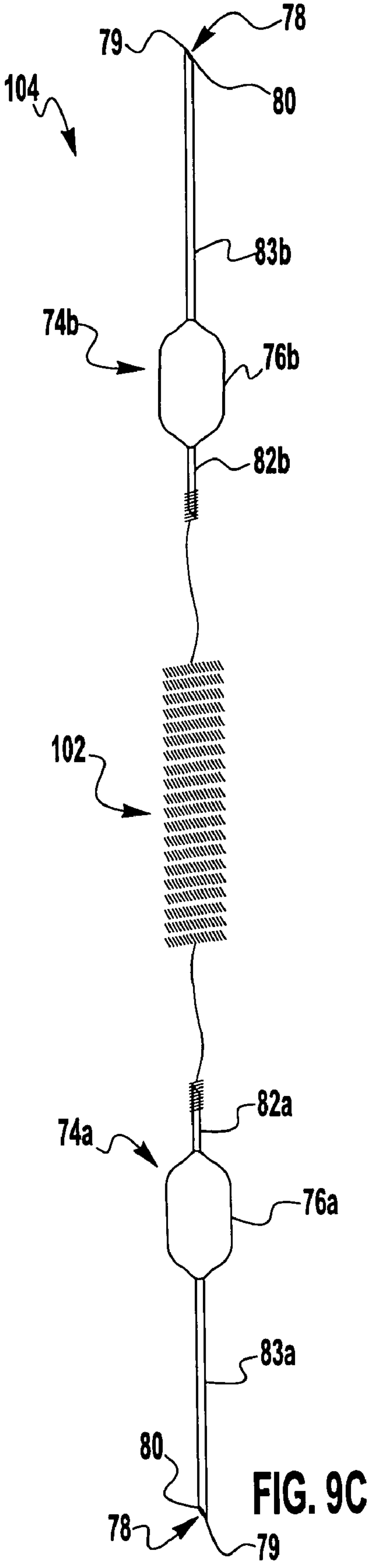
Figure 10A:
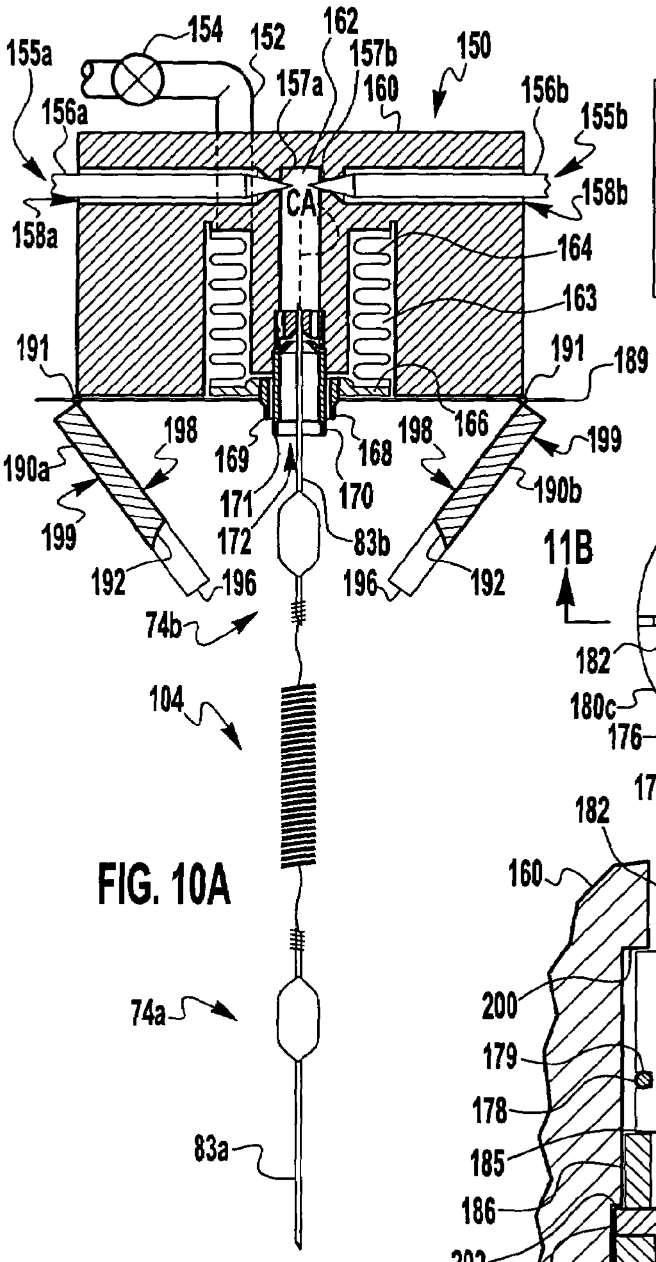
Figure 11C:
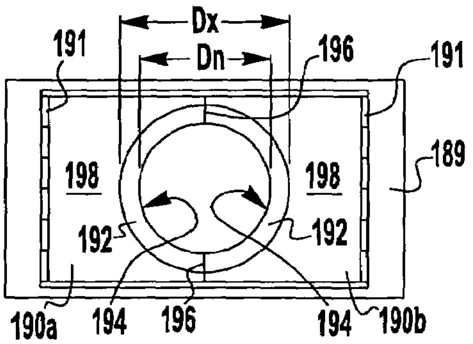
Figure 11A:
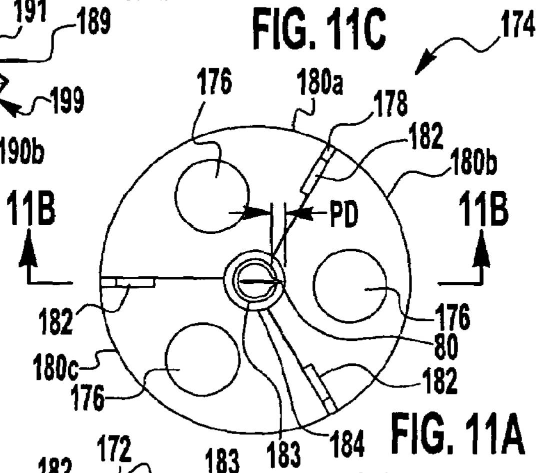
Figure 11B:
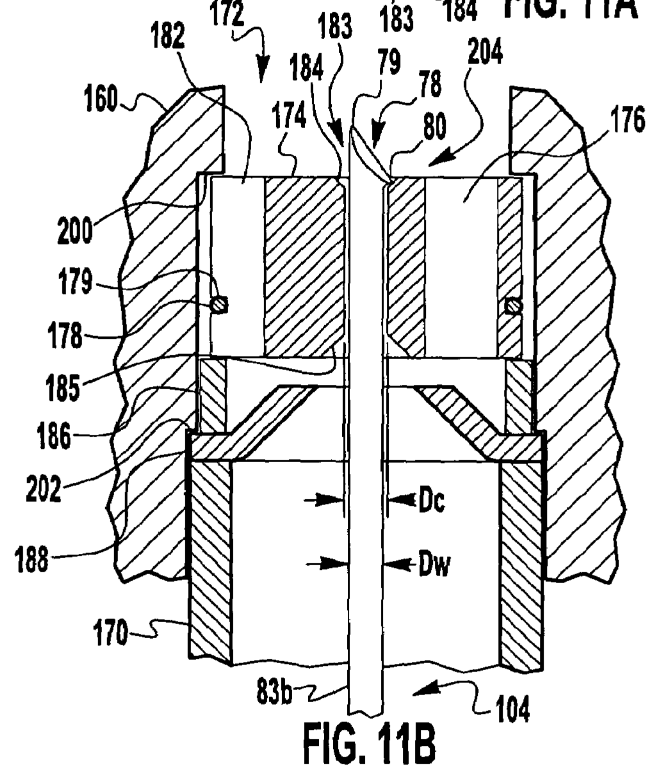
Figures 10B, 15A:
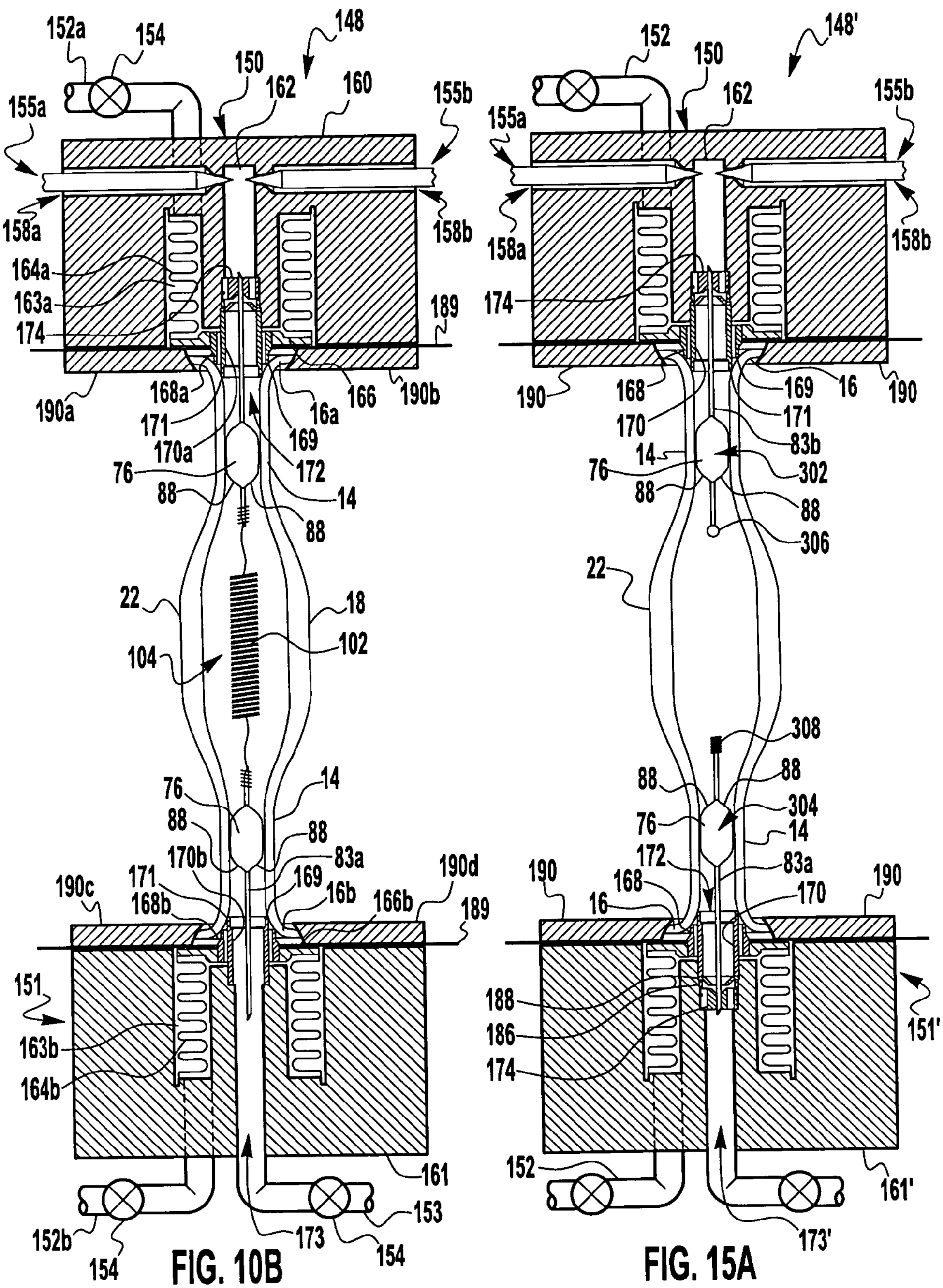
Figure 10C:
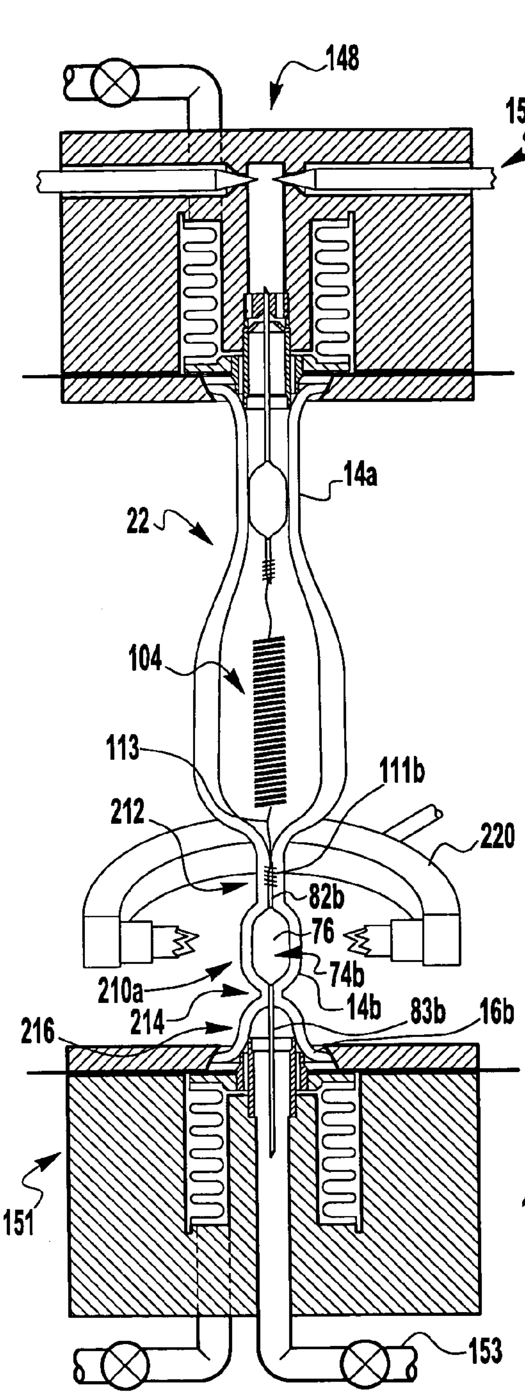
Figure 10D:
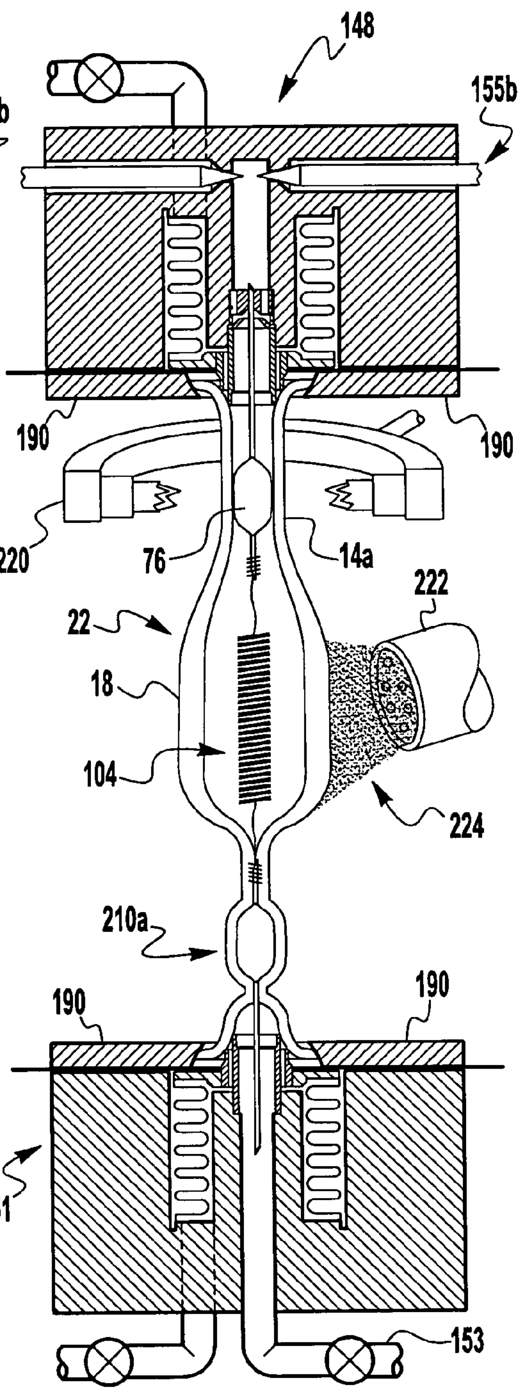
Figure 10E:
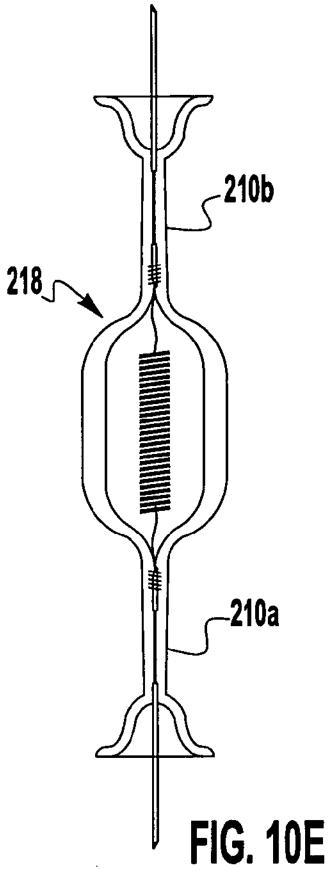
Figure 10F:
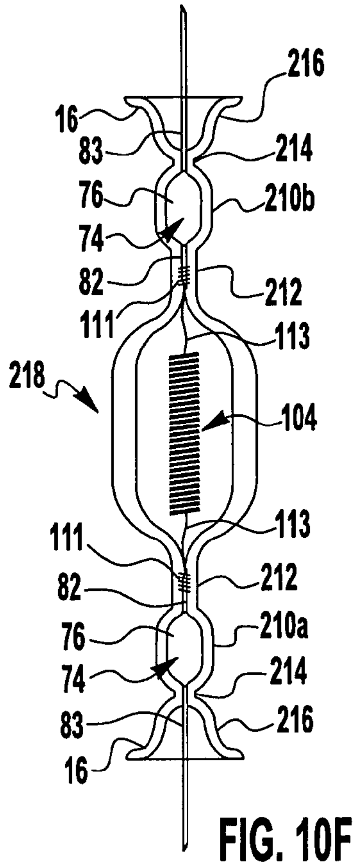
Figure 15B:
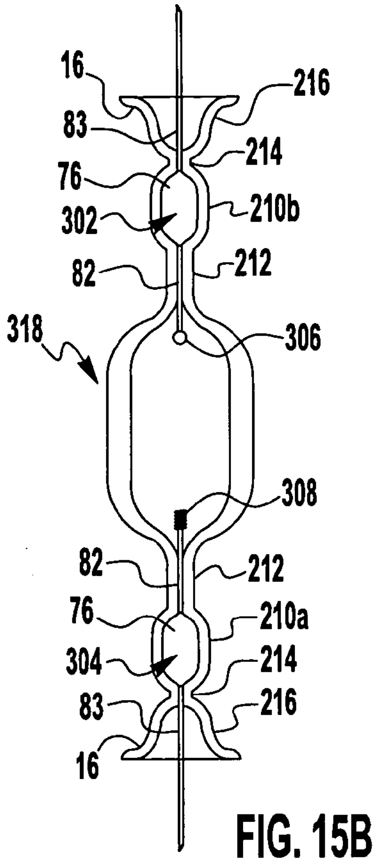
Figure 12A:
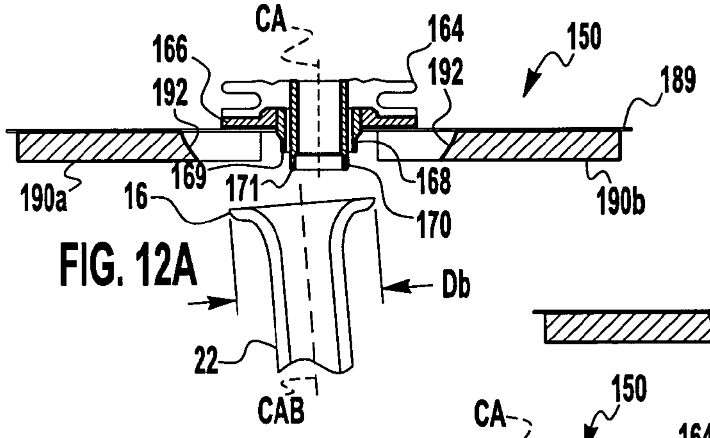
Figure 12B:
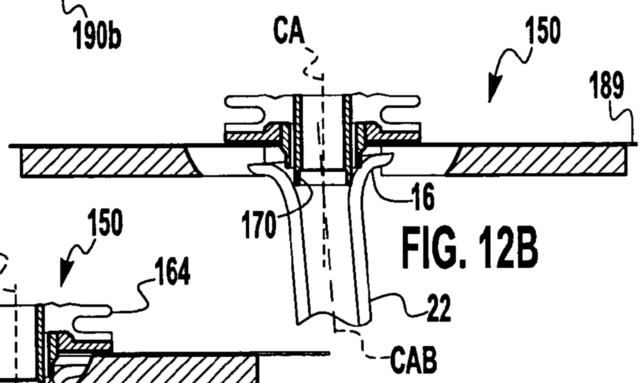
Figure 12C:
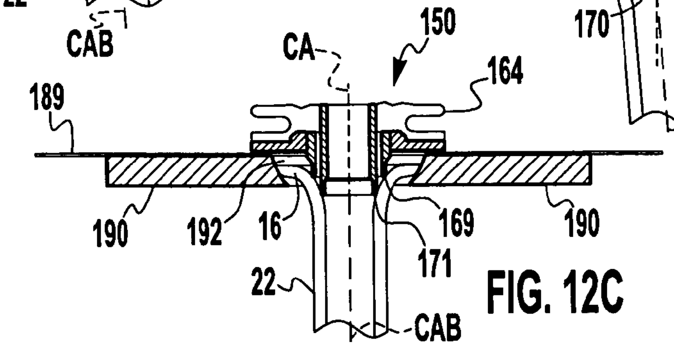
Figure 13A:
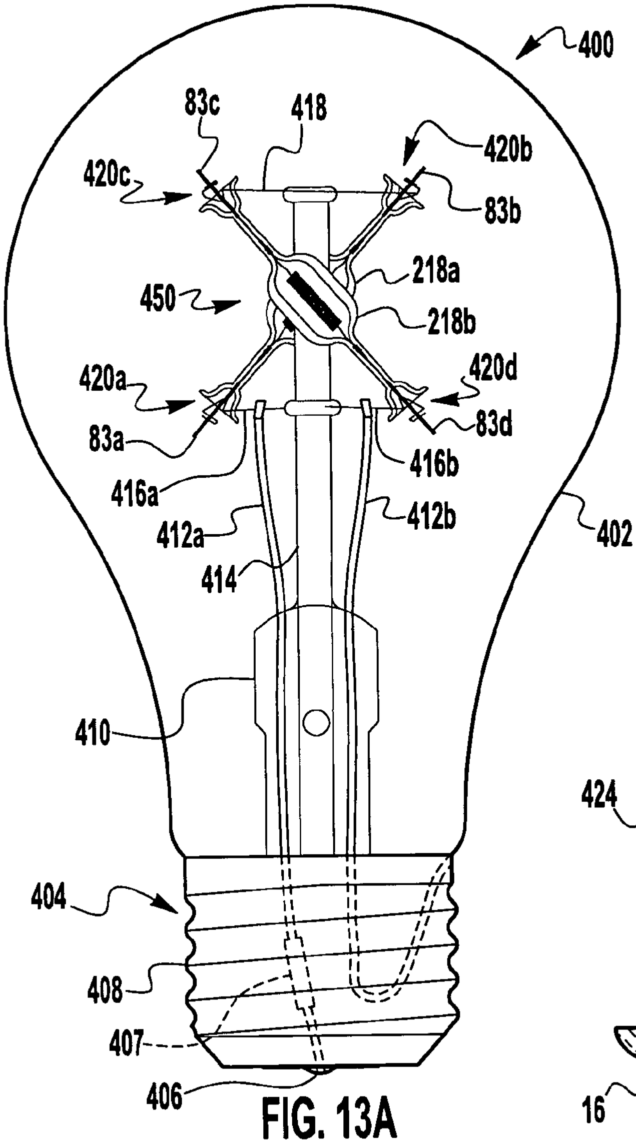
Figure 13B:
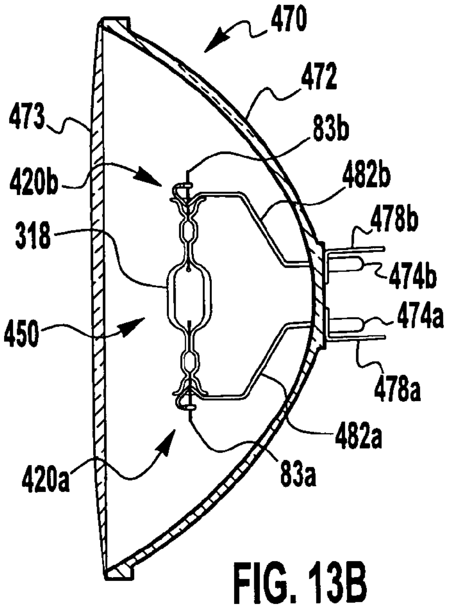
Figure 14:
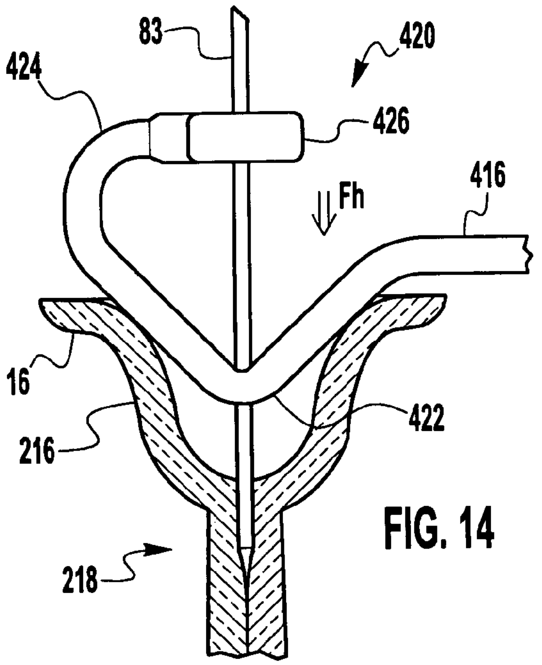

The structure, operation, and advantages of the present preferred embodiment of the invention will become further apparent upon consideration of the following description taken in conjunction with the accompanying drawings, wherein:

FIG. 1A is a filament tube light source assembly in process, according to the prior art;

FIG. 1B is a lamp assembly, according to the prior art;

FIGS. 2A–2E illustrate a process for manufacturing double ended, tipless bodies for light sources as practiced on a lathe, according to the invention;

FIG. 2A is a side view of a working end of tubing stock in the lathe, according to the invention;

FIG. 2B is a side view of the tubing being heated by a shaped burner, according to the invention;

FIG. 2C is a side view of a necked-in portion of the tubing being heated by a narrow-flame burner, according to the invention;

FIG. 2D is a side view of a cusped maria formed in the necked-in portion of the tubing, according to the invention;

FIG. 2E is a side view of a completed body cut off of a remaining portion working end of the tubing, according to the invention;

FIG. 2F is a side view of two completed bodies cut off of a remaining portion working end of the tubing, made by alternate process embodiments according to the invention;

FIG. 3 is a side view of a lead processing line for implementing a foliated lead manufacturing process, according to the invention;

FIG. 4A is a cross-sectional view, taken along the line 4A—4A of FIG. 3, of a wire that is positioned between working faces of hammers for foliating the wire in a hammering stage of the foliated lead manufacturing process, according to the invention;

FIG. 4B is a cross-sectional view, taken along the line 5B—5B of FIG. 5A, shading omitted for clarity, of idealized (flattened) profiles of the wire as it progresses from an unhammered wire down to an N-blow foil in the hammering stage of the foliated lead manufacturing process, according to the invention;

FIG. 5A is a top view of a foil resulting from the hammering stage of the foliated lead manufacturing process, according to the invention;

FIG. 5B is a cross-sectional view, taken along the line 5B—5B of FIG. 5A, of the foil resulting from the hammering stage of the foliated lead manufacturing process, according to the invention;

FIG. 6A is a top view of a straightened foil resulting from a foil straightening process of the foliated lead manufacturing process, according to the invention;

FIG. 6B is a cross-sectional view, taken along the line 6B—6B of FIG. 6A, of the straightened foil resulting from the foil straightening process of the foliated lead manufacturing process, according to the invention;

FIG. 7A is a top view of wire, foliated according to the invention, that is passing through first and second etching baths in a foil etching stage of the foliated lead manufacturing process, according to the invention;

FIG. 7B is an end view of a grommet seal for allowing passage of the foliated wire through the etching baths of FIG. 7A, according to the invention;

FIG. 8A is a perspective view of a wire cutter, according to the invention;

FIG. 8B is a side view of a portion of wire having a straight cut end with double-sided spurs resulting from a cutting process, according to the invention;

FIG. 8C is an edge view of a straight or angled cut end resulting from the cutting process, according to the invention;

FIG. 8D is a side view of a portion of wire having an angled cut end with a one-sided spur resulting from the cutting process, according to the invention;

FIG. 8E is a top view of a one-piece foliated lead that results from a preferred embodiment of the lead manufacturing process implemented on the lead processing line of FIG. 3, according to the invention;

FIGS. 9A–9C illustrate a process for manufacturing light source filament assemblies, according to the invention;

FIG. 9A is a side view of a primary coil comprising a filament wire that is wound on a primary mandrel, according to the invention;

FIG. 9B is a side view of a coiled coil filament being assembled with first and second foliated leads (portions visible), according to the invention;

FIG. 9C, is a full side view of a completed filament assembly, according to the invention;

FIGS. 10A–12C and FIGS. 15A–15B illustrate preferred embodiments of a light source finishing process for manufacturing light sources, according to the invention;

FIG. 10A is a cross-sectional view of a finishing head, with the filament assembly of FIG. 9C (not cross-sectioned) held in a collet of the finishing head, and with clamshells hingedly opened downward, according to the invention;

FIG. 10B is a cross-sectional view of a finishing stand comprising the colleted top finishing head of FIG. 10A holding the filament assembly of FIG. 9C (not cross-sectioned), and a colletless bottom finishing head, with the light source body (not shaded) of FIG. 2E sealingly held by closed clamshells of both finishing heads, according to the invention;

FIG. 10C is a view of the finishing stand of FIG. 10B illustrating a step of the light source finishing process comprising making a first seal of the body around a foliated lead of the filament assembly, according to the invention;

FIG. 10D is a view of the finishing stand of FIG. 10B illustrating a step of the light source finishing process comprising freezing fill gas into the body and making a second seal of the body around a foliated lead of the filament assembly, according to the invention;

FIG. 10E is a side, foil-edge view of a finished filament tube light source, according to the invention;

FIG. 10F is a side view, rotated 90° from the view of FIG. 10E, of a finished filament tube light source, according to the invention;

FIG. 11A is a top view of the collet of the colleted finishing head of FIG. 10A, according to the invention;

FIG. 11B is a cross-sectional view, taken along the line 11B—11B of FIG. 11A, of the collet of FIGS. 10A and 11A, showing portions of the finishing head in which the collet is mounted, according to the invention;

FIG. 11C is a top view of clamshells hingedly connected to a frame, according to the invention;

FIG. 12A is a cross-sectional view of a bugled end of a light source body (not shaded) being loaded into a finishing head for which relevant portions are shown including an inner tube and clamshells, according to the invention;

FIG. 12B is the finishing head portions and bugled end of FIG. 12A showing the bugled end being laterally centered by interacting with the inner tube, according to the invention;

FIG. 12C is the finishing head portions and bugled end of FIG. 12B showing the bugled end being coaxially aligned with the inner tube by the closed clamshells, according to the invention;

FIG. 13A is a side view of an embodiment of a lamp wherein two filament tube light sources are mounted in a general service incandescent lamp, according to the invention;

FIG. 13B is a side view, with an outer envelope shown in cross-section, of an embodiment of a lamp wherein one arc tube light source is mounted in a sealed beam headlamp, according to the invention;

FIG. 14 is a side view, with body material shown in cross-section, of a bugled end of a light source body illustrating an electrical support connection to an outer lead wire of the light source, according to the invention;

FIG. 15A is a cross-sectional view of a finishing stand comprising a colleted top finishing head holding a first electrode assembly (not cross-sectioned), and a colleted bottom finishing head holding a second electrode assembly (not cross-sectioned), with the light source body (not shaded) of FIG. 2E sealingly held by closed clamshells of both finishing heads, according to the invention; and FIG. 15B is a side view of a finished arc tube light source, according to the invention.

DETAILED DESCRIPTION OF THE INVENTION

The present invention, described hereinbelow in preferred embodiments, comprises manufacturing process steps that improve upon prior art processes for the manufacturing of light sources (both filament tube and arc tube), and lamps employing said light sources, generally by mounting the light source within an outer envelope of a lamp. The improved manufacturing process steps result in improved subassemblies, improved light sources, and improved lamps, all of which are therefore intended to be within the scope of the herein-disclosed invention(s). Many of the inventive improvements are directed toward cost-reducing light source production, specially for lamps that comprise one or preferably two light sources mounted in an outer envelope. In particular, the cost-reduced improved processes can be utilized in the manufacturing of a lamp such as the Gemini lamp wherein two filament tubes are mounted in an outer envelope to form a lamp that is affordable for common household consumer usage as a result of the inventive cost reduced manufacturing processes.

The preferred embodiments are described primarily for "filament tube" type light sources that use an incandescent tungsten filament, generally coiled, and mounted within a tubular quartz (fused silica) envelope (light source body) to form a tipless double ended filament tube. More particularly, the preferred embodiment light source is a 60 volt, 50 watt halogen filament tube for mounting two-in-series in a lamp outer envelope (e.g., lamp 400 in FIG. 13A) thereby creating a 100 W, 120V halogen lamp. The quartz tube is hermetically sealed around the filament by means of the well known technique of using a thin molybdenum foil as the electrical conductor passing through each seal area (the hermetic seal). Many of the same components and processes can be extended for use in the manufacturing of double ended, tipless "arc tube" type light sources (e.g., metal vapor discharge lamps), and all such alternate embodiments—some examples of which are herein illustrated and described—are intended to be within the scope of the present invention. The term "light source" is therefore intended to encompass any electrically-powered source of radiation (e.g., visible, infrared, etc.) that is manufacturable according to the present invention, particularly for incandescent filament light sources generally known as filament tubes, and for arc-between-electrodes light sources generally known as arc tubes. Furthermore, herein-disclosed processes may have other applications, which are also intended to be within the scope of the present invention. For example, the foliated wire and it's manufacturing process could be used in other types of quartz sealing applications. For example, the light source bodies could be manufactured according to the inventive process as adapted to form glass or other non-quartz vitreous material that can be, for example, sealed around wires instead of the described foliated lead wires. Accordingly, the terms quartz and glass may be used herein interchangeably, and are intended to be exemplary embodiments of a broader class of vitreous materials, particularly those that are suitable for light source manufacturing.

As detailed in the background hereinabove, the prior art contains many examples of light sources comprising either filament tubes or arc tubes that are housed in an outer envelope to form a complete lamp. Furthermore, various manufacturing processes for such lamps are described, e.g., by the Ahlgren '932 patent. By way of reference, FIGS. 1A and 1B show prior art filament tube and lamp assemblies, e.g., as described in the Ahlgren '932 patent (part numbering modified). FIG. 1A shows a hollow tubular light source body 1010 held in a head 1016 of a horizontal glass lathe for further processing. A filament assembly 1012 is provided having a filament 1012A with predetermined voltage characteristics, a first lead 1012B having one of its ends 1110 with attachment means shown as a hook-shape section 1012C and its other end connected to a first foliated seal member 1012D which is further connected to one end of the filament 1012A. A second lead 1012E having one end 1112 with attachment means shown as a loop extension section 1012F and its other end connected to a second foliated seal member 1012G which, in turn, is further connected to the other end of the filament 1012A. Subsequent processing yields a finished filament tube light source 1100 that is shown in FIG. 1B as being mounted in a type of lamp that is a sealed beam headlamp 1170. The sealed beam headlamp 1170 has a reflector 1172 and lens 1173 and a pair of ferrules 1174 and 1176 located at the base of the reflector 1172. The ferrules 1174 and 1176 are respectively connected to a pair of electrical terminals 1178 and 1180. The filament 1012A of the light source 1100 is connected across the pair of ferrules by first 1182 and second 1184 electrical support wires that are electrically and mechanically connected to the first and second lead ends 1110 and 1112, respectively. During filament tube processing, the attachment means 1012C, 1012F have been cut off, and the body 1010 has been formed as shown in FIG. 1B. In particular, the filament 1012A is centered in a blown-out portion 1118, and the body 1010 has been sealed 1102, 1104 about the first and second seal members 1012D, 1012G, respectively, wherein the sealing process is completed after pumping, flushing, and filling the light source body 1010 with a suitable light source ingredient. The processing of the light source is accomplished through the legs 1106, 1108 of the body 1010, thereby obviating the need for an extra exhaust tube and its tip-off. The prior art also discloses similarly-manufactured light sources that employ opposed arc electrodes in place of the filament 1012A, thereby creating an arc tube type of light source that can be similarly mounted in an outer envelope such as the reflector 1172 and lens 1173 to form a lamp.

Light Source Body Manufacturing

FIGS. 2A–2E show an improved process for manufacturing double ended, tipless bodies (e.g., body 22 in FIG. 2E) for light sources (e.g., filament tubes, arc tubes). This process can be practiced on any suitable glass lathe, and is preferably automated to both minimize manufacturing cost, and to provide dimensional consistency from part to part. Furthermore, one or more of the suitable glass lathes can be incorporated as a portion of an assembly line, preferably automated, that makes light sources and lamps according to the invention. The described embodiment of the body manufacturing process is illustrated with a horizontal glass lathe, although the horizontal orientation is not intended to be limiting. However, it may be noted that making an end-to-end symmetric bulb would more difficult on a vertical lathe due to unsymmetrical heat loss. The inventive body manufacturing process will be seen to be a cycle that proceeds in order through steps illustrated by FIG. 2A, followed by FIG. 2B, etc., through FIG. 2E which is then cyclically followed by the step of FIG. 2A, and so on—thereby sequentially manufacturing multiple light source bodies 22 from a single length of tubing stock material. FIGS. 2A–2E illustrate lathe-formed tubing in profile wherein it should be understood that the profile shapes (including contours and dimensions) are rotationally equivalent about a longitudinal axis of the tubing.

FIG. 2A shows a headstock 6 of a glass lathe 4 (only relevant portions of the lathe 4 are illustrated as needed in FIGS. 2A–2E). The collet of the headstock 6 is laterally and longitudinally fixed, but rotates at predetermined speeds as required. The headstock collet 6 grips a length of hollow tubular vitreous material, e.g., 3×5 mm quartz tubing 10 (nominally 3 millimeter inside diameter, 5 millimeter outside diameter D1, and thus a 1 millimeter wall thickness T1). Since multiple light source bodies 22 are to be formed from a single length of tubing 10, the lathe 4 is adapted to accommodate a suitable length dimension for a supply end 10*b* of the tubing 10 extending to the right of the headstock 6. To the left of the headstock 6 a working end 10*a* of the tubing 10 extends. In FIG. 2A the working end 10*a* has been previously worked such that it comprises a transitional portion 12, a necked-in portion 14, and a bugled end 16. The illustration of FIG. 2A assumes that the working end 10*a* is the result of completing the step illustrated by FIG. 2E and removing a light source body 22 completed in that step. It should be obvious that in the case of starting with a new length of tubing 10, the steps of FIGS. 2B–2E must be carried out on a working end 10*a* that does not have a transitional portion 12, a necked-in portion 14, and a bugled end 16, in order to create these requisite portions for the next implementation of the step of FIG. 2A. Also obviously, the body resulting from this first process cycle will be undesirably single-ended, and is generally scrapped, although as an alternative it could be turned around and joined to the non-bugled working end 10*a* of another new length of tubing 10. A tailstock collet 8 (see FIG. 2B) will obviously need to be able to accommodate the diameter of the tubing 10 as well as the diameter of the necked-in portion 14. It is also advantageous to use collet jaws that have, for example, swivel pads in order to accommodate tapered and/or skewed tubing profiles.

FIG. 2B shows a step wherein a tailstock collet 8 of the lathe 4 has gripped the necked-in portion 14 of the working end 10*a* and pulled it through a loosened headstock collet 6 to stop the bugled end 16 at a first predetermined position 21*a*, whereupon the headstock collet 6 is retightened, and the lathe 4 (by means of the headstock 6 and tailstock 8) begins rotation of the tubing 10 at a predetermined rotational speed. A shaped burner 26 is positioned at a first burner position 23*a* such that heat (e.g., from a flame 28) is applied to the working end 10*a* of the tubing 10. The first burner position 23*a* is selected to produce a body 22 of a desired overall length L (referring to FIG. 2E). The flame 28 is preferably shaped by the shaped burner 26 to vary the amount of heat produced by different portions of the flame 28, thereby heating the tubing 10 in a way that varies along the length of the tubing 10 in a predetermined pattern (shape). The shape of the flame 28 may continuously vary, but a simple example of flame shaping is presented in FIG.

2B wherein the flame 28 has a central low heat zone 28*b* that is symmetrically bookended by two higher heat zones 28*a*, 28*c*. Immediately after the flame 28 has heated the tubing 10 to a predetermined temperature above its softening point, the tailstock 8 is biased with a controlled amount of a bias force F1 directed to the left, thereby placing the tubing 10 in tension. In its simplest form, the bias force F1 can be applied with a weight on cable and pulley arrangement. A more sophisticated method comprises, for example, a stepper motor with force limiting controlled to start stretching the tubing 10 at the appropriate time. Preferably some form of controller 5 is provided to control force, timing, rate, and extent of the stretching induced in the heated region of the tubing 10. The controller 5 (e.g., a programmable controller 5 associated with the lathe 4) preferably also controls timing and positioning of the shaped burner 26 such that the flame 28 is turned on and off, optionally varied in heat output and optionally controlled separately in its heat zones 28*a*, 28*b*, 28*c*. Further preferably, the shaped burner 26 is moved left in concert with the leftward movement of the bugled end 16, thereby constantly maintaining heat in the center of a stretched-out (and therefore necked-in) portion 14' of the tubing 10 (refer to FIG. 2C). Alternatively, the headstock 6 and tailstock 8 may be moved equal distances at the same rate in opposite directions. This, of course, requires a lathe with a longitudinally moveable headstock.

FIG. 2C shows a step that starts with the working end 10*a* that has been shaped by the process of the previous step of FIG. 2B. Preferably the lathe is still rotating the tubing 10 at a predetermined speed. Under the influence of the bias force F1, the tubing 10 that was heated by the shaped burner 26 has been stretched to form the stretched-out portion 14' bookended by a left transitional portion 12*a* and a right transitional portion 12*b*. A bulb 18 portion of the tubing 10, with the original straight-sided outside diameter D1 and wall thickness T1, remains between the left transitional portion 12*a* and a previous transitional portion 12*c* (12 in FIG. 2A that was formed in a previous process cycle). The flame heat zones 28*a*, 28*b*, 28*c* of the shaped burner 26 have been adjusted to create a smooth contour for the transitional portions 12*a*, 12*b*, and movement of the shaped burner 26 can assure that the left transitional portion 12*a* has substantially the same contour as the right transitional portion 12*b*. It should be noted that the contour of the transitional portions 12*a*, 12*b* not only longitudinally varies smoothly in outside diameter, but optionally also longitudinally varies smoothly in wall thickness. Smooth variation is herein defined to include a monotonic variation from a first dimension to a second, different dimension. With suitable process control, the transitional portions 12*a*, 12*b* will smoothly transition between the tubing 10 outside diameter D1 and a smaller predetermined necked-in diameter D2; similarly the tubing 10 wall will smoothly transition between a tubing 10 wall thickness T1 and a predetermined necked-in wall thickness T2 that is optionally smaller than the tubing wall thickness T1. Preferably a necked-in portion inside diameter (D2–2*T2) is approximately equal to, or slightly larger than a foil width Wf for a sealing foil (e.g., foil 76 in FIG. 6B). It should also be noted that the controller 5 provides control that is consistent, precise and repeatable from cycle to cycle such that the shape and dimensions of the previous transitional portion 12*c* are substantially duplicated or mirrored by the shape and dimensions of the left transitional portion 12*a* and the right transitional portion 12*b*. The step of FIG. 2C proceeds such that a first cooling time is allowed after removal of heat from the shaped burner 26 (e.g., the shaped burner 26 is moved away from the tubing 10). The first cooling time is sufficient to allow the tubing 10 to cool at least below its glass transition temperature. After completion of the first cooling time, a narrow-flame burner 30 is positioned at a second burner position 23*b* selected such that heating from a flame 32 of the narrow-flame burner 30 is applied to a relatively narrow cylindrical band 24 of the rotating tubing 10, the band 24 being located at a longitudinal center of the stretched-out portion 14' (i.e., at the second burner position 23*b*). As soon as the tubing 10 in at least the longitudinal center 23*b* of the cylindrical band 24 becomes plastic, the narrow-flame burner 30 is turned off and/or removed and a longitudinal compressive force F2 is applied to the working end 10*a* (e.g., the tailstock 8 is forced to the right) while the tubing 10 cools down through the glass transition temperature.

FIG. 2D shows a step that starts with the working end 10*a* that has been shaped by the process of the previous step of FIG. 2C. The compressive force F2 has been applied (e.g., by a spring, not shown) in a way that relatively quickly moved a previous bugled end 16*c* (an instance of the bugled end 16 shown in FIGS. 2A, 2B, 2C) from the second predetermined position 21*b* to a third predetermined position 21*c*. It is known in the glass working arts that longitudinal compression applied to a heated tube will produce a bulged-out region commonly called a “maria”. If the compressive force is applied after the glass becomes plastic and continued while the glass cools down through the glass transition temperature, the center of the maria (where the glass is hottest) will bulge out the most and is likely to form a sharply cusped contour where the cooler and therefore stiffer glass on the left of the maria’s center essentially tangentially joins the cooler glass on the right of the center. A maria that is cusped this way would normally be considered defective because it is very fragile, i.e., liable to easily crack along the cusp. According to the present invention, a relatively high longitudinal compressive force F2 is applied to the working end 10*a* until after the heated band 24 of tubing 10 cools below the glass transition temperature such that a cusped maria 20 is intentionally formed comprising a cusp 19 (providing a fragile ring around the center of the stretched-out portion 14' of the working end 10*a*), and on either side of the cusp 19 providing left and right bugled ends 16*b*, 16*c*, respectively. Each bugled end 16 comprises an end for the tubing 10 that is flared out diametrically and has a rotationally symmetric profile similar to that of the bell of a bugle. After forming the cusped maria 20, the lathe 4 continues to rotate until the tubing 10 has cooled at least below the glass transition temperature, whereupon the lathe 4 stops rotating. Either just before, or soon after the lathe 4 stops rotating, the cusp 19 is caused to break by placing it in tension (a longitudinal break-off force F3), optionally assisted by tapping on the headstock collet 6 with a hammer 2, thereby initiating a mild shock wave that will cause a ring-off type of crack to occur along the line of the fragile cusp 19.

FIG. 2E shows a step that starts after the completion of the process of the previous step of FIG. 2D. The lathe 4 is no longer rotating, and the tailstock 8 has been moved to the left after the cusped maria 20 has been wrung-off. As a result, the working end 10*a* of the previous step (illustrated in FIG. 2D) has been separated into a completed body 22 and a remaining portion working end 10*a'*. Preferably the lathe controller 5 has controlled the formation of the cusped maria 20 such that the formation is repeatable from cycle to cycle, thus forming duplicate (identical though mirrored) shapes at both ends of each body 22 as well as substantially duplicate overall shapes from body 22 to body 22. In other words, the previous transitional portion 12*c* is substantially duplicated or mirrored by the shape and dimensions of the left transitional portion 12*a* and the right transitional portion 12*b*; the previous necked-in portion 14*c* is substantially duplicated or mirrored by the shape and dimensions of the left necked-in portion 14*a* and the right necked-in portion 14*b*; and the previous bugled end 16*c* is substantially duplicated or mirrored by the shape and dimensions of the left bugled end 16*a* and the right bugled end 16*b*. In terms of dimensions, outside diameters D1, D2 and wall thicknesses T1, T2 (defined hereinabove) are controlled to be substantially duplicated in every relevant portion of every body 22 produced according to the present invention. Length dimensions, measured longitudinally along the tubing 10 and body 22, are illustrated in FIG. 2E and should likewise be understood to be controlled so as to be substantially duplicated in every relevant portion of every body 22 produced according to the present invention. The body 22 has a body length L that is subdivided into two bugled end lengths LB1, LB2; two necked-in portion lengths LN1, LN2; two transitional portion lengths LT1, LT2; and one bulb length LB. The corresponding lengths in the remaining portion working end 10*a*' have a right bugled end length LB3; a right necked-in portion length LN3; and a right transitional portion length LT3. Suitable control by the controller 5 will cause the bugled end lengths to be substantially equal to each other (LB1=LB2=LB3); the necked-in portion lengths to be substantially equal to each other (LN1=LN2=LN3); and the transitional portion lengths to be substantially equal to each other (LT1=LT2=LT3). Similarly, the body length L and the bulb length LB will be substantially equal to their corresponding lengths in all bodies 22 made according to the present invention.

To complete the step of FIG. 2E, the tailstock collet 8 is opened and the body 22 is removed for further light source assembly processes. For example, the body 22 could be ejected or otherwise caused to fall into an accumulation tray (not shown). For example, a mechanical transfer could grip the body 22, remove it from the tailstock 8, and transfer the body 22 for further processing. Following removal of the body 22, the process cyclically proceeds to the step of FIG. 2A, wherein the remaining portion working end 10*a*' becomes the new working end 10*a* for the process step of FIG. 2A. Similarly, the right bugled end 16*b*, the right necked-in portion 14*b*, and the right transitional portion 12*b* become the new bugled end 16, necked-in portion 14, and transitional portion 12, respectively.

It can be seen that the light source body 22 formed by the above-described inventive process is a tipless double ended body formed without the complication and expense of blowing out into a mold or using a cutoff saw/torch/laser/etcetera. As will be seen in the description hereinbelow, the bugled ends 16*a*, 16*c* (collectively referred to as 16) not only provide a simple means of cutoff, but also provide advantages in a finishing (e.g., flush/fill) process and in mounting of the light source in a lamp. The bulb portion 18 can be of any desired bulb length LB, including the limiting case wherein the transitional portions 12*a*, 12*c* (collectively referred to as 12) adjoin each other causing a straight sided bulb length LB of zero, thereby forming a smoothly rounded center for the body 22 similar to mold-blown bulb contours of the prior art. Such a body 22 with a rounded center may be desired for a small arc tube, for example. If the body 22 is formed with the optional variation in wall thickness (see FIG. 2C), then several possible advantages ensue. Less tubing 10 is utilized in each body 22. The necked-in portions 14*a*, 14*c* (collectively referred to as 14) will be less massive, and therefore will store less heat in an operating light source. In a filament tube wherein an incandescent filament is mounted in the body 22 (as described hereinbelow), the transitional portions 12 can be shaped, thinned, and positioned relative to the ends of the filament such that the body 22 is substantially isothermal at least around the enclosed volume of the light source during operation of the filament tube light source.

A further advantage of the inventive bugled ends 16 is the ability to use them for making a simple connection to a blow pipe in manufacturing processes wherein it is desired to blow out the bulb 18 (e.g., blowing into a mold). As shown, for example, in FIG. 12B, a relatively airtight connection between a tube (e.g., tube 170) and the bugled end 16 can be made simply by pushing the tube (e.g., 170) into the bugled end 16, even if the tube (e.g., 170) is slightly off-axis relative to the body 22. Furthermore, a cut off single-bugled working end 10*a* could be turned around and joined to the non-bugled working end 10*a* of a new length of tubing 10, thereby providing a bugled end 16 for making a blowing connection for the first body 22 being formed at the working end of a new length of tubing 10.

FIG. 2F illustrates several features of light source bodies produced by possible alternate embodiments of the present inventive process. A first alternate body 922*a* and a second alternate body 922*b* (produced in sequence after the first alternate body 922*a*) are shown after being cut off to leave a remaining portion working end 910*a*' that is still held by the headstock 6 of the lathe 4. Two different cutoff methods are used in alternating sequence for successive alternate bodies 922*a*, 922*b*. The cusped maria process, described hereinabove, has been used to create left and right alternate bugled ends 916*a*, 916*b* where the first alternate body 922*a* has been cut apart from the second alternate body 922*b* in a second cutoff 915*b*. However, a first cutoff 915*a* and a third cutoff 915*c* were made using a method other than the inventive cusped maria process (a non-maria cutoff method) to create non-bugled ends 917, collectively referring to a previous non-bugled end 917*c* at the first cutoff 915*a*, plus a left non-bugled end 917*a* and a right non-bugled end 917*b* at the third cutoff 915*c*. The non-maria cutoff method used for the alternate embodiment illustrated in FIG. 2F can be, for example, a known method employing a cutoff saw. By alternating cutoff methods, it can be seen that each of the alternate bodies 922*a*, 922*b* will have one bugled end (e.g., 916*a* or 916*b*) and one non-bugled end (e.g., 917*c* or 917*a*).

FIG. 2F also illustrates another simplification of the inventive process whereby the necked-in portions (e.g., 14*a*, 14*c* for the body 22 in FIG. 2E) are omitted from the body manufacturing process. For example, the first alternate body 922*a* has an alternate bulb 918 longitudinally centered in the overall body length L, having a bulb length LB and a bulb diameter equal to the tubing outside diameter D1. The alternate bulb 918 is bookended by diametrically opposed tubular portions: a left tubular portion 914*a* having a left tubular portion length LL1 and a left tubular portion diameter equal to the tubing outside diameter D1; and a right tubular portion 914*b* having a right tubular portion length LL2 and a right tubular portion diameter equal to the tubing outside diameter D1 (except for the bugled end 916*a*). The tubular portions 914*a*, 914*b* in this example have equal lengths (i.e., LL1=LL2). Later light source manufacturing steps include sealing the tubular portions 914*a*, 914*b* around lead wires and it should be noted that shrink sealing, for example, will neck in part of each tubular portion 914*a*, 914*b*, thereby further defining the shape and dimensions of the alternate bulb 918.

Lead Manufacturing

FIGS. 3–8E show an improved process for manufacturing one piece foliated leads (e.g., foliated lead 74 in FIG. 8E) for sealing in light sources (e.g., filament tubes, arc tubes). This process is preferably automated (e.g., using a lead processing line 40 as shown in FIG. 3) to both minimize manufacturing cost, and to provide dimensional consistency from part to part. Furthermore, one or more of the lead processing lines 40 can be incorporated as a portion of an assembly line, preferably automated, that makes light sources and lamps according to the invention.

FIG. 3 shows a preferred embodiment of the inventive lead manufacturing process, exemplified by the lead processing line 40, which has several inventive features as detailed in FIGS. 4A–8E, described hereinbelow. The lead processing line 40 starts on the left with a wire supply spool 44 of wire 42, processes the wire 42 into a foliated wire 43 by creating a spaced string of foils 76, and then finishes on the right by sequentially cutting completed one piece foliated leads 74 off the end of the foliated wire 43 (for convenience in the foregoing discussion, the terms "wire 42", and "foliated wire 43" may be used interchangeably and each term should be understood to include the other term where logically appropriate since both terms refer to the same wire 42 being processed and advanced through the lead manufacturing process). The wire 42 is preferably molybdenum wire suitable for sealing and having the same diameter (e.g., 0.007") as a primary mandrel (e.g., 106 in FIG. 9A) for a filament (e.g., 102 in FIG. 9B) of the filament tube type of light source that will be made using the foliated lead 74. Alternatively for arc tube light sources, the wire 42 is molybdenum wire that is suitable for sealing and for making into an arc electrode (e.g., first and second electrodes 306, 308 in FIG. 15A). Further alternatively for arc tube light sources, the electrode (e.g., 306, 308) can be separately made (e.g., from tungsten wires), and subsequently attached (e.g., butt welded) to the foliated lead 74 that is produced by the lead manufacturing process described herein.

The spool 44 incorporates suitable tensioning devices (e.g., spool brake 45) and wire guiding capabilities (not shown). The wire 42 is advanced through the lead processing line 40 by a wire advancing device embodied here as an advancing gripper 56 combined with a stationary gripper 58 such that the foliated wire 43 is held by the stationary gripper 58 while the advancing gripper 56 with open jaws moves to the left, and the foliated wire 43 is advanced to the right by the advancing gripper 56 with closed jaws while the stationary gripper 58 has open jaws. The advancing gripper 56 (e.g., under control of a stepper system) is also used in combination with the spool brake 45 to function as a tensioning device that provides tension and movement for accommodating elongation of the wire 42 as described hereinbelow. The grippers 56, 58 have jaw shapes, and are positioned, such that the foils 76 are not damaged by the gripping and advancing operations (e.g., the foils 76 are never touched by the grippers 56, 58).

The lead processing line 40 produces a new foliated lead 74 every cycle, wherein the machine cycle comprises: advancing the wire 42, and processing portions of the wire 42 simultaneously in each of several stages of the lead manufacturing process. The wire 42 is advanced by a "step" distance selected to produce a uniform desired foil spacing FS (see FIG. 7A). It will be seen that the selected amount of initial advancement is slightly less than the foil spacing FS in order to accommodate elongation of the wire 42 that occurs in some of the stages. Thus during each machine cycle the wire 42 is advanced one step equaling the foil spacing FS, but comprised of an initial advancement distance plus the small amount of elongation that occurs during the cycle. The machine cycle timing (per completed foliated lead 74) is determined by the most time-consuming stage of operation, that being a hammering stage that has been proven at a rate of at least 90 per minute, i.e., a cycle time of 0.67 seconds. The stages of the lead manufacturing process will now be presented in sequential order.

Referring to FIGS. 3, 4A and 4B, a first stage of the lead manufacturing process is foil hammering wherein a portion of the wire 42 is hammered into a thin, sharp-edged sealing foil between a top hammer **46*a* and a bottom hammer 46*b* driven by a hammering drive 47. The hammers 46*a*, 46*b* (collectively referred to as hammers 46) are cemented carbide and have identically shaped working surfaces: a working face 92 on a truncated conical frustum 90. The working face 92 has a slightly convex surface centered on an axis of revolution AR, and is rounded at an edge 94 where it transitions to the frustum 90. For example, the working face 92 has an oblate spheroid surface with a major-to-minor axis ratio of about 100 to 1, wherein an axis of revolution AR lies along the minor axis of the oblate spheroid, and the rounded transition edge 94 ends at the frustum 90 along the major axis of the oblate spheroid. The hammers 46 are arranged such that the working faces 92 are aligned to be centered on a common axis of revolution AR with opposed working faces 92 that are mirror images of each other; and furthermore such that hammering motion is along the common axis of revolution AR. The working face 92 has a diameter DWF that is selected to determine a suitable foil length Lf and foil width Wf (see FIGS. 6A–6B). For example, the working face diameter DWF is 0.125", and can be used to hammer a molybdenum wire 42 having a 0.007" wire diameter Dw into a foil having a foil length Lf of approximately one eighth of an inch and a foil width Wf of slightly less (e.g., approximately 0.1"). The wire 42 is advanced between the working faces 92 of the hammers 46 by an amount selected to produce a uniform desired foil spacing FS (see FIG. 7A) and stops with the wire 42 positioned along a diameter of the working face 92 (i.e., crossing the central, highest point of the working face 92, orthogonally crossing the axis of rotation AR). The wire 42 is hammered between the working faces 92 with a number N of blows in as rapid succession as possible. (It is believed that this will advantageously maximize the amount of heat in the wire 42 that is produced by the hammering.) The number N of blows is experimentally determined for a given wire material and diameter; e.g., for the 0.007" diameter molybdenum wire the number N has been determined to be 10. An important feature of the process is that for a given magnitude of energy E provided in the first blow, each subsequent blow has an energy that is at least linearly increased by the energy magnitude E over its preceding blow. For example: the first blow has an energy magnitude of E; the second blow has an energy magnitude of 2×E (2 times E); the third blow has an energy magnitude of 3×E; and so on to the final Nth blow having an energy magnitude of N×E. The increasing energy is necessary in order to produce a sharp-edged foil contour (e.g., foil edge 77); otherwise the foil will tend to flatten in the middle or even doughnut without appreciably more stretching and thinning of the foil edges 77. The energy magnitude E along with the number of blows N are experimentally determined for a given wire material and diameter so as to produce a desired foil thickness Tf. For example, the foil thickness Tf is 0.001". It has been noted that the foil edges 77 are thinned and sharpened by this wire flattening process. The resulting foil edge 77** is easily etched to yield an even sharper razor edge that is ideal for optimum sealing of the foil in vitreous material (e.g., quartz).

Top and cross-sectional views of a foil 75 resulting from the hammering stage are shown in FIGS. 5A and 5B, respectively. The resulting foil 75 tends to be slightly cupped (although the illustration exaggerates this effect). FIG. 4B shows idealized cross-sectional views (shading omitted for clarity) of the middle of the foil 75 after progressive hammer blows. The cross-section is taken as shown in FIG. 4A, at the point where the wire 42 intersects the axis of revolution AR; for example, along the line 5B—5B of FIG. 5A, however for illustrative purposes it is idealized by showing the profile as straight rather than cupped as in FIG. 5B. The idealized profiles in FIG. 4B progress from an un-hammered wire 42*a* having a wire diameter (and foil thickness) Dw, down to an N-blow foil 42*f* having the desired foil thickness Tf (as measured at it's center). For example, a 2-blow foil 42*b* shows the foil cross-sectional profile after 2 hammer blows on the wire 42; a 4-blow foil 42*c* shows the foil cross-sectional profile after 4 hammer blows on the wire 42; a 6-blow foil 42*d* shows the foil cross-sectional profile after 6 hammer blows on the wire 42; a 8-blow foil 42*e* shows the foil cross-sectional profile after 8 hammer blows on the wire 42; a 10-blow foil 42*f* shows the foil cross-sectional profile after 10 hammer blows on the wire 42 (where N=10).

The idealized profiles in FIG. 4B are merely illustrative of one possible scenario. Various cross-sectional shapes have been observed at various points in the hammering process including the following: The progression in cross-sectional shapes goes from round to wiener shape after the first blow, with the waist portion taking the shape of the hammer faces 92. As the blows increase in energy, the working faces 92 themselves progressively compress. The overall foil 75 gets thinner, but the center again becomes thicker relative to the edges, presumably due to a hydrostatic "capturing" of the molybdenum such that the edges almost cease to flow. Cross-sectional shapes then progress from elliptical to lenticular in nature. Toward the end of the process it may be that the compressive forces over the whole active area are very high, but are higher in the center than at the edges of the working faces 92, thus producing the cupped effect when expansion occurs after relief of the pressure of the last blow. As the foil 75 gets thinner and thinner it resists plastic flow more and more. Lengthwise elongation decreases, and with further blows beyond N, the extruded foil along the length continues to thin until it is too fragile to be useful.

Because of longitudinal pressure on the tapered surface of the wire 42 where it transitions from the foil to the wire, the wire 42 tends to elongate even more than the foil width. During the hammering process the lead processing line 40 should provide a suitable bias force on the wire 42 to prevent longitudinal rippling or folding of the foil; for example the advancing gripper 56 can advance further during hammering, or can incorporate a spring tensioner while the spool brake 45 resists. Preferably provisions are made to keep the hammers 46 centered in the foil 75 to avoid a longitudinally asymmetric foil 75; for example the hammers 46 are advanced a predetermined amount after each hammer blow, or the spool brake 45 pulls the wire 42 backward a predetermined amount after each hammer blow while the advancing gripper 56 pulls the wire 42 forward an equal predetermined amount.

An exemplary reduction to practice (not specifically illustrated) of the inventive hammering process comprised a hammering drive 47 with the bottom hammer 46*b* mounted on a massive, rigid base, and the top hammer 46*a* slidably mounted in a vertical guide channel. In lab tests, the top hammer 46*a* was raised a height H and dropped for the first blow, raised a height 2×H and dropped for the second blow, and so on until it was raised a height 10×H for the final $10^{th}$ blow. Thus the energy provided by the falling weight increased linearly for each blow in proportion to the height of the fall. In another reduction to practice test, the top hammer 46*a* was in turn hammered by a hammering drive 47 comprising a swinging hammer attached to a leaf spring that was raised against spring force by a constant-speed rotating cam wheel incorporating 12 cam steps. Each of the first ten cam steps raised and then released the spring, but the eleventh and twelfth cam steps held the spring and the top hammer 46*a* up slightly to allow advancing the wire 42. Each of the first ten cam steps raised the spring more than the preceding cam step in a linear progression, thereby yielding a geometric progression in hammering energy (proportional to the square of the spring raising distance, and therefore more than linear). It is anticipated that the inventive hammering process can be implemented with many different forms of hammering drive 47 including, for example, hammering drives 47 that use electromagnetic/solenoidal force rather than the above-described exemplary mechanical methods.

Referring to FIGS. 3, and 5A–6B, a second stage of the lead manufacturing process is a foil straightening stage that preferably also includes flame etching of the foil. Foil straightening is desired because the hammering process tends to produce a slightly cupped contour for the foil 75 as shown in FIGS. 5A and 5B (cupping illustratively exaggerated). For example, a first face 84*a* is concave while the other, second face 84*b*, is convex. The cupped foil 75 is bistable (concave-convex), can angle the wire 42 on either side out of collinearity, and may not present the best shape for sealing. However, when straightened according to the invention, the cupped foil 75 becomes a straight foil 76 that has advantageous stiffening edges 77'. In the preferred embodiment, heat for the second stage is provided by a burner 48 having a flame 49 that is positioned for heating the cupped foil 75 after the cupped foil 75 is advanced out of the hammers 46. The flame 49 is long enough to accommodate movement of the cupped foil 75 as the wire 42 and cupped foil 75 elongate during the cycle due to hammering and straightening. The flame 49 is optionally extended, and further optionally segmented, in order to heat a plurality of foils 75, 76 at a plurality of foil step locations in order to continue heating the foils 75, 76 for a plurality of cycle times. Foil straightening is accomplished by applying a tensile force on the wire 42 and thus on the cupped foil 75 (e.g., by means of the advancing gripper 56), preferably while heating the cupped foil 75. A side benefit of the inventive foil straightening process is that the wire 42 can also be straightened, if necessary, by the same process. The foil 76 resulting from the foil straightening process is shown in top and cross-sectional views in FIGS. 6A and 6B, respectively. The elliptical dish shape of the cupped foil 75 has been stretched flat on the two longitudinal ends, and in the foil middle. The sharp edges 77 have been stretch straightened out-of-round and tend to curl around a longitudinal line to produce substantially longitudinally linear, curled edges 77' that provide collinearity for inner lead wire 82 and outer lead wire 83, and bending stiffness for the foil 76, and therefore for the foliated lead 74. Although the edges 77 are stretched the most, the overall foil length also increases slightly from a cupped foil length Lcf to a foil length Lf, both lengths being measured between the two locations where the foil 75, 76 starts to transition from the foil thickness Tf to the wire diameter Dw. Thus the inventive straightening process provides a simplified, improved method for achieving many of the same benefits of prior art foil stiffening methods such as that disclosed in the Karikas '356 patent. The curled edges 77' both generally curl toward the same foil face (e.g., first face 84*a*), therefore they do not exactly center the foliated lead 74 in a light source body (e.g., body 22) before sealing in the same way as the bi-folded foils of Karikas. However, the inventor has determined that centering occurs anyway with the present foliated leads 74 when the body 22 is sealed about the foil 76, and furthermore the foliated leads 74 also provide desired alignment of the foliated lead 74 with the necked-in portion 14 and therefore with the body 22.

A further advantage of the inventive foliated leads 74 made according to the inventive hammering process is the shape of leading/trailing ends 88 of the foil 76. The resulting tapered or at least rounded-off shape of the leading/trailing ends 88 is a feature of the inventively hammered foil 76 that eases threading of the foliated lead 74 into a close-fitting tube (e.g., the necked-in portions 14 of the light source body 22).

In the art of making light source sealing foil, it is known that the best edge for sealing is obtained by etching a flattened metal strip, regardless of the method used for that flattening. Two methods for foil etching are chemical or electrochemical etching, and flame etching (using an oxidizing flame to burn away metal). A disadvantage of flame etching is that it leaves an oxide coating that may interfere with sealing. Therefore, a third stage of the lead manufacturing process is a foil etching stage preferably using an electrochemical etching process that will also clean any oxide coating off of the foliated wire 43, and may even etch more efficiently when the foliated wire 43 has been oxidized previously. Therefore, an optional alternate embodiment of the lead manufacturing process uses an oxidizing flame for the flame 49 to combine flame etching with foil straightening. Further alternate embodiments of the lead manufacturing process replace electrochemical etching with an oxidizing flame 49 for flame etching followed by cleaning by, for example, heating in a reducing atmosphere such as forming gas.

The preferred embodiment of the lead processing line 40 incorporates an electrochemical etching process for a third, foil etching stage of the lead manufacturing process. Referring to FIGS. 3, 7A and 7B the third stage comprises a first etching bath 50*a* followed by a second etching bath 50*b* (collectively referred to as etching baths 50), followed by a rinsing bath 52, and finally followed by a dryer 54. The first and second etching baths 50*a*, 50*b* are respectively filled to a first and second fluid level 86*a*, 86*b* with an electroetching fluid 53*a*, 53*b* collectively referred to as electroetching fluid 53 (e.g., an alkali such as sodium hydroxide). In order to preclude possible damage to the foils 76, the foliated wire 43 follows a conveyance path that passes straight through the etching baths 50 and the rinsing bath 52 instead of being redirected down into and up out of each bath by a typical series of rollers or pulleys. The straight-through conveyance path is enabled by passing the foliated wire 43 through relatively liquid-tight grommet seals 72 that are mounted within holes 51 below the fluid level 86*a*, 86*b* in both longitudinal ends of each bath 50*a*, 50*b*, 52. The grommet seal 72 is made of a resilient material (e.g., rubber, plastic, etc.) having a slit 73 that flexes sufficiently to allow passage of the foliated wire 43 through the grommet seal 72, but still holds the slit 73 closed enough to prevent significant fluid loss leaking through from the bath 50*a*, 50*b*, 52. Leaked fluid can be replenished by capturing it and pumping it back into the bath 50*a*, 50*b*, 52, or simply by replacement with fresh fluid, thereby maintaining constant caustic concentration. An exemplary grommet seal 72 was produced by using a short length of soft rubber, thick walled tubing with a pinch-clamp. Compression by the pinch-clamp produced the slit 73 and the electroetching fluid 53 provided an excellent lubricant. It is within the scope of the present invention to abut the ends of successive baths 50*a*, 50*b*, 52 and to use a single grommet seal 72 between each pair of abutted baths 50*a*, 50*b*, 52. Furthermore, said abutment should be herein construed to include combination of the abutted ends into a single dividing wall. Alternatively, the single grommet seal 72 between successive baths 50*a*, 50*b*, 52 could be a short length of small diameter tubing, possibly pinched to form a slit 73, the tubing extending between the holes 51 in the ends of the successive baths 50*a*, 50*b*, 52.

Chemical etching is enhanced by electrolysis using an inventive two-bath AC (alternating current) electrolysis method that doesn't require a mechanical connection of electrical power to the foliated wire 43, again in order to avoid damage to the foliated wire 43, and also to increase reliability and efficiency. One pole of an AC electrolysis power supply 66 is connected by a first supply wire 68*a* to a first electrode 70*a* in the first etching bath 50*a*, and the opposite pole of the electrolysis power supply 66 is connected by a second supply wire 68*b* to a second electrode 70*b* in the second etching bath 50*b*. The circuit is completed, for example, by electrical current being conducted by ions in the electroetching fluid 53*a* in the first etching bath 50*a* from the first electrode 70*a* to the foliated wire 43 in the first etching bath 50*a*, the current then being conducted by the foliated wire 43 from the first etching bath 50*a* to the second etching bath 50*b*, the current then being conducted by ions in the electroetching fluid 53*b* in the second etching bath 50*b* from the foliated wire 43 in the second etching bath 50*b* to the second electrode 70*b*. In the succeeding half cycle of AC, the current flow is reversed. Electrolytic etching of the foliated wire 43 alternates between the first and second etching baths 50*a*, 50*b* depending upon the direction of current in the etching bath 50. A first bath length BL1 and a second bath length BL2 are selected to provide a total etching bath length (BL1+BL2) sufficient to allow enough machine cycle times for each foil 76 to be etched as desired while it steps through the etching baths 50. The first and second etching bath lengths BL1, BL2, respectively, are preferably approximately equal in order to balance the current density in the two baths 50*a*, 50*b*. An advantage of the inventive two-bath etching method is that the current carried between baths 50*a*, 50*b* by the foliated wire 43 can be relatively high because of the cooling provided by the electroetching fluid 53, especially when the baths 50 are connected by a single grommet seal 72, thereby preventing exposure of the foliated wire 43 to air between the baths 50.

Referring to FIG. 3, after passing through the etching baths 50, the foliated wire 43 (now etched) is passed straight through the rinsing bath 52. Other than inventively passing the foliated wire 43 through the rinsing bath 52 by means of grommet seals 72 as described for the etching baths 50, the rinsing bath uses conventional means to rinse electroetching residue from the foliated wire 43 (e.g., using de-ionized water). A length of the rinsing bath 52 is selected to allow enough machine cycle times for each foil 76 to be rinsed as desired while it steps through the rinsing bath 52. After passing through the rinsing bath 52 the foliated wire 43 is passed through a conventional dryer 54 (e.g., hot air) that is preferably non-oxidizing.

FIGS. 3 and 8A–8E illustrate a final, fourth stage of the lead manufacturing process that comprises a cutting stage. After the foliated wire 43 passes through the foil etching stage, the foliated wire 43 is advanced by the advancing gripper 56 and pushed out through the stationary gripper 58 and a cutter 60. At a point during the machine cycle when the advancing gripper 56 is not moving, and the length of foliated wire 43 protruding beyond the blade edges 63 is sufficient to yield a predetermined foliated lead length Lfl after cutting, the stationary gripper 58 optionally closes to hold the foliated wire 43 while the cutter 60 closes to cut a foliated lead 74 off the end of the foliated wire 43. The newly manufactured foliated lead 74 is made available for further light source manufacturing processes, optionally by allowing it to fall into a collection tray 64; but preferably by using a transfer 62 (e.g., vacuum head on swing arm) to hold the foliated lead 74 as it is cut off and to then move it into the collection tray 64 or on to a next portion of a light source assembly line.

An inventive cutting process produces straight cut ends 78*a* or angled cut ends 78*b* (collectively referred to as cut ends 78) on the foliated lead 74 that respectively have intentionally-formed double-sided spurs 80*a*, or a one-sided spur 80*b* (80*a* and 80*b* being collectively referred to as spurs 80). The spurs 80 protrude laterally beyond the diameter of the wire 42 that becomes a lead wire 82, 83 (e.g., the inner lead wire 82) of the foliated lead 74, and the spurs 80 are then utilized to improve subsequent assembly and handling operations as will be described hereinbelow. The cutter 60 has a top blade 59*a* and a bottom blade 59*b* (collectively referred to as cutter blades 59) that are preferably identically shaped with a blade edge 63 defined at the vertex of a left blade side 61*a* and a right blade side 61*b* (collectively referred to as blade sides 61). The cutter 60 has a central plane CP, and the top blade 59*a* is positioned above the bottom blade 59*b* such that both blade edges 63 lie within the central plane CP. Furthermore, the cutter 60 has a configuration wherein cutting motion of the cutter 60 is such that the cutting blade edges 63 move substantially within the central plane CP, thereby bringing the blade edges 63 together to cut the foliated wire 43. In general, the best spurs 80 are produced by cutting with dull-edged (i.e., blunt) cutting blade edges 63 such that the cutting process is one of essentially "mashing apart" the foliated wire 43 as with dull nippers. Preferably the blade sides 61 are substantially straight and form a relatively broadly sloped blade angle $\alpha$ at the vertex (blade edge 63), the blade angle $\alpha$ being in the range of about 60°–120°, most preferably about 90°. Preferably the blade sides 61*a*, 61*b* are reflected across the central plane CP, i.e., each is at an angle of $\alpha/2$ from the central plane CP. The foliated wire 43 is positioned in the cutter 60 such that a wire 42 portion at a predetermined distance from the nearest foil 76 (e.g., an inner lead length Lil) is between the blade edges 63. In a vertical direction, the wire 42 is perpendicular to the central plane CP. In a horizontal direction, the wire 42 is at a cut angle $\theta$. FIGS. 8B and 8C show the straight cut end 78*a* that results from cutting at a cut angle $\theta$ equal to about 90°. Because of the shape of the cutter blades 59 with relatively broadly sloped blade sides 61, the round wire 42 is pinched in, which causes displaced wire material to extrude outwards by a protrusion distance of PD on each side (measured radially), thereby creating the double-sided spurs 80*a*. FIGS. 8D and 8C show the angled cut end 78*b* that results from cutting at a cut angle $\theta$ that is acute, preferably about 45°–75°, most preferably about 60°. Because of the shape of the cutter blades 59 with relatively broadly sloped blade sides 61, the round wire 42 is pinched in, which causes displaced wire material to extrude outwards by a protrusion distance of PD (measured radially), thereby creating the one-sided spur 80*b*. In addition to the one-sided spur 80*b* that protrudes laterally on the side of the acute cut angle $\theta$, the other side of the angled cut end 78*b* is rounded toward the center of the wire 42, thereby creating a point 79 at the outermost end of the lead wire 82, 83. The angled cut end 78 is most preferred for the present invention because it not only has the spur 80 but also the point 79, both of which provide advantages in subsequent assembly and handling operations according to the invention as will be described hereinbelow. Trials of the inventive cutting process using 0.007" diameter molybdenum wire 42 resulted in spurs 80 having a protrusion distance PD of approximately 0.001".

FIG. 8E shows the foliated lead 74 that results from a preferred embodiment of the inventive lead manufacturing process implemented on the lead processing line 40. The foliated lead 74 has an overall foliated lead length Lfl, is formed from one continuous piece of material (originally the wire 42), and comprises a single foil 76 (for sealing in a light source body, e.g., body 22) bookended by an outer lead wire 83 and an inner lead wire 82. The foil 76 has curled edges 77', a foil length Lf, and a foil width Wf. The outer lead wire 83 has an outer lead length Lol and a diameter equal to the wire diameter Dw of the wire 42. The inner lead wire 82 has an inner lead length Lil and a diameter equal to the wire diameter Dw of the wire 42. Both lead wires 82, 83 outwardly end in cut ends 78, preferably angled cut ends 78*b* that have a point 79 and a spur 80.

The lead processing line 40 has been described as a single, complete multistage line, but it should be recognized that the scope of the invention is intended to include the use of individual stages of the line, possibly separated from other stages by means of collecting the foliated wire 43, for example, on a reel of sufficient diameter to preclude introducing permanent bending or other damage to the foliated wire 43; and then unreeling the foliated wire 43 from the reel to continue the lead processing elsewhere.

Filament Assembly

FIGS. 9A–9C show an improved process for manufacturing filament assemblies (e.g., filament assembly 104 in FIG. 9C) for light sources (e.g., filament tubes, arc tubes) wherein two foliated leads 74 (first foliated lead 74*a* and second foliated lead 74*b*) are assembled together with an incandescent lamp filament (e.g., filament 102) therebetween and prepared for assembly with a light source body (e.g., body 22). This process is preferably automated to minimize manufacturing cost, and to provide dimensional consistency from part to part. Furthermore, one or more filament assembly processes can be incorporated as a portion of an assembly line, preferably automated, that makes light sources and lamps according to the invention.

FIG. 9A shows a primary coil 100 comprising a filament wire 108 that is wound on a primary mandrel 106, preferably with periodically varied coiling pitches P1, P2, P3, thereby creating a continuous length of primary coil 100 having a repeating sequence of: a first spud portion 110*a*, preferably followed by a first stretched-out portion 112*a*, followed by an incandescent portion 114; and then preferably followed by a second stretched-out portion 112*b*. The sequence repeats beginning with a second spud portion 110*b*. It should be noted that the spud portions 110*a*, 110*b* (collectively referred to as 110) are each cut in half when a filament 102 is created from the primary coil 100. Referring also to FIG. 9B, the preferred embodiment of the present invention includes a 50 W (watt), 60 V (volt) filament 102 that utilizes a coiled coil portion 115 for the incandescent part of the filament 102. It should be recognized that light sources according to the present invention may have other wattage/voltage combinations, and can be achieved, for example, with single coil filaments, and with or without a stretched-out portion 112*a*, 112*b* (collectively referred to as 112).

For the preferred embodiment, the primary mandrel 106 is molybdenum wire having a mandrel diameter Dm (e.g., 0.007"), and the filament wire 108 is tungsten filament wire having a filament wire diameter Dfw (e.g., 0.0025"). The incandescent portion 114 is the longest portion of the primary coil 100, being long enough to accommodate the length of filament wire required for a particular voltage/wattage/life design. The coiled coil portion 115 has a coiled coil pitch P4, and a coiled coil outside diameter Dcc (e.g., 0.042") that are determined according to conventional design principles. An incandescent primary coil pitch P3 is also determined according to conventional design principles. A spud portion pitch P1 is preferably equal to the incandescent primary coil pitch P3. A stretched-out portion pitch P2 is stretched as much as possible to result in, for example, up to three lazy turns in a stretched-out portion length Lst. The spud portion 110 has a spud portion length Lsp of approximately twice the length desired for a spudding operation to be described hereinbelow. If desired, the continuous length of primary coil 100 may be annealed on the primary mandrel 106 before secondary coiling.

The filament 102 is formed by: (a) extending a first leg 116*a* comprising a first spud coil 111*a* (being half of the first spud portion 110*a*) plus a first stretched-out leg 113*a*; (b) secondary coiling, i.e., winding one incandescent portion 114 of the primary coil 100 around a removable secondary mandrel (conventional, not shown) to form the coiled coil 115; (c) extending a second leg 116*b* comprising a second stretched-out leg 113*a* plus a second spud coil 111*a*; (d) removing the secondary mandrel; (e) cutting the primary coil 100 in the approximate middle of the second spud portion 110*b*; and (f) dissolving the primary mandrel 106. Sintering of the coiled coil 115 may be done according to conventional practice, e.g., between steps (e) and (f), or possibly after the following optional step (g). An optional step (g) after dissolving the primary mandrel 106 is to further stretch and straighten the first and second stretched-out portions 112*a*, 112*b* in order to form first and second legs 116*a*, 116*b* that are almost-straight single strands of filament wire 108 having a stretched-out leg length Lst' that may be significantly longer than the stretched-out portion length Lst of the primary coil 100. This optional step (g) can be used to create stretched-out legs 113*a*, 113*b* even when the stretched-out portions 112 of the primary coil 100 are not stretched (i.e., the stretched-out portion pitch P2 is equal to the incandescent primary coil pitch P3). In step (e) each filament 102 is cut off an end of the continuous length of primary coil 100 by means of cutting the primary coil 100 in the approximate longitudinal center of a spud portion 110, thereby creating filament spud coils 111*a*, 111*b* (collectively referred to as 111) that are approximately half the length of the spud portions (i.e., spud coil length Lsp' is approximately half of the spud portion length Lsp).

Referring to FIGS. 9B and 9C, the filament assembly 104 comprises a filament 102 that is assembled together with a first foliated lead 74*a* and a second foliated lead 74*b*. The first foliated lead 74*a* has a first inner lead 82*a*, a first foil 76*a*, and a first outer lead wire 83*a*. The second foliated lead 74*b* has a second inner lead 82*b*, a second foil 76*b*, and a second outer lead wire 83*b*. As described hereinabove, each of the foliated leads 74 has two cut ends 78, and each cut end 78 has at least one spur 80, and preferably a point 79 (when the cut end 78 is the preferred angled cut end 78*b*). The foliated leads 74 are made using wire that becomes the inner lead wires 82*a*, 82*b* and has a wire diameter Dw. The inside diameter of the spud coils 111 is approximately the same dimension as the primary mandrel diameter Dm upon which they were wound. For the preferred embodiment illustrated in FIG. 9B, the first inner lead wire 82*a* of the first foliated lead 74*a* is shown as it is being assembled with the filament 102, and the second inner lead wire 82*b* of the second foliated lead 74*b* is shown after being assembled with the filament 102. The illustrated assembly is accomplished by a spudding process wherein the cut end 78 of an inner lead wire 82 becomes a "spud" that is inserted into a tight fitting spud coil at the end of a leg 116 of the filament 102. Although spudding is known, the present invention provides an improved spudding process due to inventive features of the inner lead wire 82. In particular, the inner lead wire outside diameter Dw is approximately the same as, or slightly more than, the spud coil inside diameter Dm; and the one or more spurs 79 on the cut end 78 provide a lateral protrusion that serves as a screw thread such that the cut end 78 can be "screwed" into the spud coil 111 and the spur(s) 79 will thereafter hook onto a turn of the spud coil 111. Because of this hooking, it is not necessary to make the inner lead wire outside diameter Dw significantly larger than the spud coil inside diameter Dm; and it is also not necessary to weld the spud coil 111 to the inner lead wire 82. A further advantage accrues when the cut end 78 is the preferred angled cut end 78*b* with a point 79, in which case the point 79 (which tends to be somewhat indented from the outside diameter of the inner lead wire 82) is used to funnel the cut end 78 into the spud coil 111, and will also help to wedge the spud coil open if it is tight.

Light Source Finishing

FIGS. 10A–12C and FIGS. 15A–15B illustrate preferred embodiments of an improved finishing process for manufacturing light sources (e.g., filament tube 218 in FIGS. 10E and 13A, e.g., arc tube 318 in FIGS. 15B and 13B) for lamps wherein a filament assembly (e.g., 104) or a pair of arc tube electrodes (e.g., first and second electrodes 306, 308 in FIG. 15A) is positioned in a light source body (e.g., body 22) that is flushed and/or exhausted, filled, sealed about foils 76, and otherwise finished. This light source finishing process is preferably automated to minimize manufacturing cost, and to provide dimensional consistency from part to part. Furthermore, one or more light source finishing processes can be incorporated as a portion of an assembly line, preferably automated, that makes light sources and lamps according to the invention.

The improved light source finishing process is inventive in that inventive equipment (e.g., a filament tube light source finishing stand 148, as in FIG. 10B, or an arc tube light source finishing stand 148', as in FIG. 15A) utilizes inventive features of component parts of the inventive light sources described herein. Exemplary embodiments of the inventive light source finishing process will be described hereinbelow, the process comprising at least partial evacuation, flushing, filling, and sealing of a light source (e.g., filament tube or arc tube). The described process embodiments are exemplary of a variety of finishing process methods and schedules, including both pump-flush and/or through-flush methods, that can be accommodated by the inventive light source finishing equipment. Likewise, the illustrated light source finishing stands 148, 148' are exemplary embodiments of a variety of configurations of light source finishing equipment that can incorporate elements and features of the inventive equipment and light source components.

FIG. 10A shows a finishing head 150 in a cross-sectional view, and FIGS. 11A and 11B are a top view and a side cross-sectional view, respectively, that show details of an inner tube assembly 172 that is part of the finishing head 150. Also shown is an exemplary filament assembly 104, suitable for use with the finishing head 150, that has been positioned in the finishing head 150 according to the invention. For the sake of clarity, the filament assembly 104 is not cross-sectioned in the side views, and the vitreous material of the body 22 is left un-shaded in the cross-sectional views. The finishing head 150 is also referred to as a top finishing head 150 due to configuration differences that distinguish it from a colletless bottom finishing head 151 (see FIG. 10B) and a colleted bottom finishing head 151' (see FIG. 15A).

The finishing head 150 comprises a block 160 of a suitable material (e.g., stainless steel, and/or with anticorrosive plating) that has a cylindrical central chamber 162 with a cylindrical axis CA. The chamber 162 is open on one end (e.g., the bottom) that is further drilled to accommodate the inner tube assembly 172 as described hereinbelow. At least two inlets 158 (e.g., first inlet 158*a* and second inlet 158*b*) access the chamber by means of respective first and second needle valves 155*a*, 155*b*, comprising a first needle valve stem 156*a* with a first needle valve orifice 157*a*, and a second needle valve stem 156*b* with a second needle valve orifice 157*b*. The first and second inlets 158*a*, 158*b* and their respective first and second needle valves 155*a*, 155*b* are designed according to the type and flow rate of gas(es) that they will be handling. Preferably the first and second needle valves 155*a*, 155*b* (collectively referred to as needle valves 155) are automatically manipulated and are suitable for shutting off as well as controlling flow rate.

Coaxial to the chamber 162 is an annular recess 163, also open on the same one end as the chamber 162. A cylindrical spring bellows 164 is sealingly attached to the closed end of the annular recess 163, preferably being attached near a radially outermost periphery of the annular recess 163, such that a shroud gas line 152, controlled by a valve 154, can open into the annular recess 163 but radially within the spring bellows 164. The open end of the spring bellows 164 is sealingly attached to a washer-like flat annular floating plate 166 that is in turn sealingly attached to an outer tube 168. The outer tube 168 coaxially surrounds the central chamber 162 and thus shares its cylindrical axis CA. The outward (e.g., bottom) edge 169 of the outer tube 168 is a thinned edge 169 for flexibility. The spring bellows 164 functions as a compression spring for biasing the outer tube 168 downward in a direction roughly parallel to the cylindrical axis CA. An inner tube assembly 172 is coaxially mounted in the open end of the chamber 162, with an inner tube 170 protruding beyond (below, further outward of) the outer tube 168. The outward (e.g., bottom) edge 171 of the inner tube 170 is a thinned edge 171 for flexibility. The thinned edges 169, 171 are thinner than the remainder of the respective tubes 168, 170, but not so thin as to become a sharp knife edge because that is too weak. For example, rather than feathering the edge, it can be turned down to make a uniformly thinner wall tube 168, 170 at the thinned edge 169, 171, and the outermost end can be polished blunt to ruggedize the thinned edge 169, 171 due to the blunt end at the same time that the polishing helps assure good sealing with the bugled end 16 of the body 22. It should be noted that various equivalent structures can achieve the described purposes of the spring bellows 164 and the floating plate 166, such as, for example, a springy annular disc-like diaphragm, or for example a separate spring plus an extendable bellows for sealing.

Both the inner tube 170 and the outer tube 168 are made from relatively thin walled metal tubing (e.g., stainless steel). Referring to FIG. 10D, it can be seen that the use of metallic components (e.g., 168, 170, 190) for sealingly connecting the finishing head 150 to the body 22 allows for sealing bodies 22 that have relatively short lengths of material between the finishing head 150 and a necked in body portion 14 that is heated by a high temperature sealing burner 220 to seal around the foil 76. Thus the inventive bugled end 16 in combination with the inventive finishing heads (e.g., 150) minimizes the amount of expensive vitreous material that is consumed in the manufacture of a finished light source.

Referring now to FIGS. 11A and 11B, the inner tube assembly 172 is a stacked assembly of coaxial components comprising a collet 174, which is stacked on a spacer ring 186, which is stacked on a funnel ring 188, which is stacked on the inner tube 170. The inner tube 170 is sealingly attached to the chamber 162 in a way that makes an approximately gas-tight seal between the innermost (upper) end of the inner tube 170 and the chamber 162 (e.g., by press fitting into a slightly tapered hole). Vertical positioning of the inner tube 170 is accomplished by means of a reduced diameter spacer stop 202. The collet 174 is vertically positioned by being trapped between the spacer ring 186 and a collet stop 200 at the top. The funnel ring 188 is optional and can be used to assist in loading the outer lead wire 83*b* of the filament assembly 104 into the collet 183. The funnel ring 188 is substantially a conical washer oriented for funneling the outer lead wire 83*b* into a center hole 183 of the collet 174. The spacer ring 186 is also optional, being an annular ring that cooperates with the optional funnel ring 188 in order to position the collet 174 suitably spaced above the funnel ring 188. Further funneling effect is achieved by a bottom bevel 185 that leads into the center hole 183. Even further funneling effect is achieved when, as illustrated, the cut end 78 of the outer lead wire 83*b* is an angled cut end 78*b* having a radially inset point 79 and an acute cut angle θ (see FIG. 8D). Without the optional funnel ring 188 and spacer ring 186, the spacer stop 202 can be repositioned such that the inner tube 170 stops against it, thereby trapping the collet 174 between the inner tube 170 and the collet stop 200. In any case, the collet stop 200 and the spacer stop 202 should be positioned such that the collet 174 is loosely trapped for allowing free and easy radial expansion/contraction movement of the collet 174 and its component parts.

The collet 174 is a spring-closed type of self-closing collet comprised of three substantially equal sectors 180*a*, 180*b*, 180*c* (collectively referred to as collet sectors 180) that are held together by a circumferentially extending circumferential spring 178 (e.g., a snap ring or an o-ring), which is captured in a spring groove 179. The collet 174 is substantially cylindrical and has a coaxial center hole 183. Gas passage through the collet 174 is enabled by longitudinal holes 176 through the collet sectors 180 and/or by longitudinal slots 182 between adjacent collet sectors 180. An optional top bevel 184 is cut at a collet top 204 junction with the center hole 183 to provide a funnel for easing the pulling of spurs 80 down through the center hole 183.

There are at least two important variants of the inventive collet 174, both of which are within the scope of the present invention. The primary embodiment is illustrated in FIGS. 11A and 11B and will be described first. A second, alternate embodiment is a dimensional variant and possible simplification of the illustrated embodiment and therefore is not separately illustrated or numbered. The primary embodiment of the collet 174 is intended to utilize the one or more spurs 80 (i.e., the one-sided spur 80*b*, or the double-sided spurs 80*a*) for vertical positioning of the filament assembly 104. In the alternate embodiment, vertical positioning must be established by other, external means (e.g., a robot arm, not illustrated, that inserts the outer lead wire 83*b* into the collet 174 to a predetermined vertical position).

When the collet sectors 180 are held together such that the collet 174 is fully closed, the center hole 183 has an inside diameter Dc. For the illustrated primary embodiment, the hole diameter Dc is dimensioned to be at least equal to, and preferably slightly larger than, the diameter Dw of the outer lead wire 83*b*, but not as large as the overall width of the wire diameter Dw plus one protrusion distance PD for the spur 80. (If double spur straight cut ends 78*a* are being used, then the hole diameter Dc can be almost as large as the wire diameter Dw plus two protrusion distances PD.) It can be seen that the collet 174, so dimensioned, will open radially against the circumferential spring 178 as the spurred cut end 78 is pushed up through the collet 174. Once the spur 80 has passed into the chamber 162 above the collet 174, the collet 174 will close around the outer lead wire 83*b* to loosely hold it approximately centered along the cylindrical axis CA. When the outer lead wire 83*b* is released, it will drop down until the spur 80 hangs on the collet top 204, thereby providing vertical positioning of the filament assembly 104. If a top bevel 184 has been provided, then depending on its dimensions, the top bevel 184 may be the portion of the collet top 204 upon which the spur 80 hangs. The collet 174 and the chamber 162 are suitably dimensioned such that the collet 174 has room to radially expand as needed, but not too much room so that the collet 174 remains approximately centered along the cylindrical axis CA.

For an alternate embodiment of the collet 174, the hole diameter Dc is dimensioned to be slightly smaller than the diameter Dw of the outer lead wire 83*b*. In this case, the collet 174, so dimensioned, will open radially against the circumferential spring 178 as the cut end 78 (with or without spurs 80) is pushed up through the collet 174. Once the cut end 78 has passed into the chamber 162 above the collet 174, the collet 174 will close around the outer lead wire 83*b* to grip and hold it approximately centered along the cylindrical axis CA. When the outer lead wire 83*b* is released, it will be held by the collet 174 to maintain a predetermined vertical positioning of the filament assembly 104.

With reference to FIGS. 10A, 10B, and 11C, the finishing head is further equipped with a left clamshell 190*a* and a right clamshell 190*b* (collectively referred to as clamshells 190) for positioning and holding the light source body 22 by acting on the inventive bugled end 16. The clamshells 190 are rectangular plates, each having an abutting edge 196 where the left and right clamshells 190*a*, 190*b* abut when the clamshells 190 are closed (as in FIGS. 10B and 11C). FIGS. 10A and 11C illustrate a first embodiment of the clamshells 190 wherein the clamshells 190 are hingedly connected to a frame 189 by means of hinges 191. Preferably the frame 189 is vertically (longitudinally) fixed or more preferably is spring biased against the finishing head 150, but is free to slide a predetermined amount in any direction within a horizontal (lateral) plane. FIG. 10A shows the hinged first embodiment of the clamshells 190 in an open position, swung downward to create an opening large enough to accept the bugled end 16 of a body 22. FIGS. 12A–12C show a second embodiment of the clamshells 190 wherein the clamshells 190 are not hinged, but instead slide horizontally, preferably left and right on a frame 189 that is vertically fixed or more preferably is spring biased against the finishing head 150, but is free to slide a predetermined amount in any direction within a horizontal plane. FIG. 12A shows the sliding second embodiment of the clamshells 190 in an open position, slidingly pulled apart such that the abutting edges 196 are spaced apart enough to accept the bugled end 16 of a body 22, but the left clamshell 190*a* remains aligned in a common plane with the right clamshell 190*b*. It should be understood that the scope of the invention is intended to include all equivalent means for opening and closing the clamshells 190. For example, the horizontal sliding movement could be in an arc driven by a scissor-like mechanism.

Referring now to FIG. 11C, both embodiments of the clamshells 190 provide a circular opening, i.e., a center hole 194 for receiving a bugled end 16, wherein each clamshell 190*a*, 190*b* has a semicircular opening cut out of its abutting edge 196. When the clamshells 190 are closed as shown, with their abutting edges 196 abutted, the center hole 194 has a minimum diameter Dn that is slightly less than a bugled end average diameter Db (see FIG. 12A), such that closing the clamshells will trap a bugled end 16, pushing upwards on the bugled end 16 to hold it against the finishing head 150. A sloped sided, preferably spherical, cavity is formed in the closed clamshells 190 such that the spherical cavity creates an annular spherical cavity wall 192 having a maximum diameter Dx where it joins a top (inner) surface 198 of the clamshells 190, and a minimum diameter Dn where it joins a bottom (outer) surface 199 (see FIG. 10A) of the clamshells 190, thereby creating the center hole 194. The remaining portions of the abutting edges 196 are preferably trimmed back a bit so that the clamshells 190 can be closed around undersized bugled ends 16. As shown in FIG. 12A, the bugled end 16 of the light source body has an average diameter Db. The clamshells 190 are dimensioned such that the maximum diameter Dx is slightly greater than the bugled end average diameter Db, and the minimum diameter Dx is slightly less than the bugled end average diameter Db. The curvature of the cavity wall 192 matches the locus of points traced by the outermost parts of the bugled end 16 as the bugled end 16 is tilted while pressed up against the inner tube 170, i.e., tilting a body cylindrical axis CAB relative to the inner tube cylindrical axis CA as shown in FIG. 12B.

Actual clamshell dimensions are easily fine-tuned to assure proper operation of the clamshells 190 according to the invention as further described with reference to FIGS. 12A–12C, which show a side cross-sectional view of relevant portions of the finishing head 150 and of a light source body 22 as it is being loaded into the finishing head 150. The illustrated portions of the finishing head 150 include an outer portion of the inner tube 170 with its thinned edge 171, surrounded by the outer tube 168 with its thinned edge 169, an outer portion of the spring bellows 164 that is attached to the outer tube 168 by means of the floating plate 166, and clamshells 190 with their frame 189. Operation of the clamshells 190 is illustrated for a sliding embodiment, but similarly applies to operation of the hinged embodiment of the clamshells 190. The inner tube 170 has a cylindrical axis CA and the outer tube 168 is approximately coaxial to the inner tube 170. Preferably the clamshells 190 open and close in a way that maintains equal spacing from the cylindrical axis CA to the spherical cavity wall 192 of each of the clamshells 190*a*, 190*b*.

In FIG. 12A, a light source body 22 having a body cylindrical axis CAB is shown as it is being loaded into the finishing head 150. It can be seen that the body 22 is laterally off center, as well as being tilted such that the body cylindrical axis CAB is at a non-zero angle relative to the cylindrical axis CA of the finishing head 150. FIG. 12B shows that as the body 22 was raised into the finishing head 150 (by a compliant holder, not shown), the bugled end 16 interacted with the inner tube 170 and was therefore laterally centered. FIG. 12C shows the result of closing the clamshells 190 in a first configuration wherein the frame 189 is horizontally (laterally) fixed with the center hole 194 coaxially aligned with the cylindrical axis CA of the finishing head 150. Thus the body 22 was also aligned (i.e., the body 22 was made coaxial with the inner tube 170) by the clamshells 190 as they closed such that the spherical cavity wall 192 pressed upward on the lowest portion of the tilted bugled end 16. Furthermore, because of the shape and dimensions of the spherical cavity wall, preferably aided by a vertical spring bias on the clamshells 190, the closed clamshells 190 exert continuous inward (longitudinal) pressure on the bugled end 16, thereby maintaining firm contact between the inner tube thinned edge 171 and the inside of the bugled end 16. Also, the spring pressure of the spring bellows 164 maintains firm contact between the outer tube thinned edge 169 and the inside of the bugled end 16. In a second configuration, wherein the frame floats in the horizontal plane, it can be seen that closing the clamshells 190 will leave the body 22 tilted as shown in FIG. 12B, but will press upward to hold the tilted bugled end 16 against the thinned edge 171 of the inner tube 170. This second configuration provides a certain amount of compliance for tolerating minor misalignment between a top finishing head 150 and a bottom finishing head 151 (see FIG. 10B), without placing any bending stress on the body 22, and furthermore allows the combination of top finishing head 150 and bottom finishing head 151 to achieve alignment of a body 22 being held between them.

FIG. 10A illustrates a first step of the light source finishing process wherein the filament assembly 104 is loaded into the top finishing head 150 where it is suspended at a predetermined vertical position by the collet 174 as described hereinabove. If the light source is to be an arc tube (e.g., 318) rather than a filament tube (e.g., 218), then a first electrode/foliated lead assembly 302 (see FIG. 15A) can be similarly loaded into the top finishing head 150.

FIG. 10B illustrates a second step of the light source finishing process wherein the filament assembly 104 is threaded into a light source body 22, and the light source body 22 is loaded into the top finishing head 150 and also into a colletless bottom finishing head 151. Both the top finishing head 150 and the colletless bottom finishing head 151 are oriented approximately vertically (e.g., the cylindrical axis CA is approximately vertical), with the top finishing head 150 being above the colletless bottom finishing head 151. As described hereinabove, the light source body 22 is laterally centered and axially aligned with the finishing heads 150, 151 by means of the interaction of bugled ends 16 (top 16*a*, and bottom 16*b*) with clamshells 190 (top left 190*a*, top right 190*b*, bottom left 190*c*, and bottom right 190*d*) and with inner tubes 170 (top 170*a*, and bottom 170*b*). The top finishing head 150 and the colletless bottom finishing head 151 are substantially axially aligned with each other, and at least one of the two finishing heads 150, 151 is compliant in its vertical positioning in order to accommodate slight variations in overall body length L. For example: the top finishing head can be resting on a bracket (not shown). The body 22 can be loaded into the colletless bottom finishing head 151 first, wherein the bottom bugled end 16*b* is held by closed bottom clamshells 190*c*, 190*d*; then the body 22 can be raised up around the filament assembly 104 to be loaded into the top finishing head 150, possibly raising the top finishing head 150 slightly as a top bugled end 16*a* presses upward against a top inner tube 170*a* of the top finishing head 150. In the case of floating clamshell frames 189, this will also finish aligning the body 22 relative to the combined top finishing head 150 and colletless bottom finishing head 151. The loading operation is completed by closing the top clamshells 190*a*, 190*b*. The funnel shape of the top bugled end 16*a* helps to guide the hanging filament assembly 104 down into the body 22, further assisted by the tapered or at least rounded-off leading/trailing ends 88 of the foils 76. While raising the body 22, the filament assembly can be further encouraged to thread down into the body 22 by directing a stream of clean, dry, inert gas down into and/or through the body 22 (e.g., shroud gas emitted between the top inner tube 170*a* and top outer tube 168*a*), optionally evacuated by an evacuation line 153 in the colletless bottom finishing head 151.

The colletless bottom finishing head 151 is mostly equivalent to the top finishing head 150. For example, the colletless bottom finishing head 151 has: a clamshell frame 189 with left and right bottom clamshells 190*c*, 190*d*, respectively, that are equivalent to the left and right top clamshells 190*a*, 190*b*, respectively; a bottom inner tube 170*b* that is equivalent to the top inner tube 170*a*; a bottom outer tube 168*b* connected by means of a bottom floating plate 166*b* to a bottom spring bellows 164*b* that is connected at an opposite end to a bottom annular recess 163*b*—all of which are equivalent to corresponding top components (i.e., a top outer tube 168*a* connected by means of a top floating plate 166*a* to a top spring bellows 164*a* that is connected at an opposite end to a top annular recess 163*a*); and a bottom shroud gas line 152*b*, controlled by a valve 154 that opens into the bottom annular recess 163*b* but radially within the bottom spring bellows 164*b*—all of which are equivalent to corresponding top components (i.e., a top shroud gas line 152*a*, controlled by a valve 154 that opens into the top annular recess 163*a* but radially within the top spring bellows 164*a*).

The colletless bottom finishing head 151 differs from the top finishing head 150 in ways that include the following. The bottom outer lead wire 83*a* may not require holding when a filament assembly 104 is suspended from the collet 174 in the top finishing head 150, therefore the colletless bottom finishing head 151 does not have a collet 174, spacer ring 186, or funnel ring 188. In place of the inlets 158*a*, 158*b* with needle valves 155*a*, 155*b*, the colletless bottom finishing head 151 has an evacuation line 153 controlled by a valve 154, that is connected to a colletless bottom finishing head chamber 173. A colletless bottom finishing head block 161 is suitably modified to accommodate the differences as compared to the block 160 of the top finishing head 150.

The top finishing head 150 and colletless bottom finishing head 151 with suitable gas, electric, and mechanical connections, combine to form an inventive filament tube light source finishing stand 148 for implementing the inventive light source finishing process, especially for filament tubes (e.g., 218).

FIG. 15A illustrates a colleted bottom finishing head 151' that can be substituted for the colletless bottom finishing head 151 for use in situations wherein it is desirable to hold a bottom outer lead wire 83*a* (e.g., in arc tube manufacturing wherein a first electrode assembly 302 is held by the top finishing head 150 and a second electrode assembly 304 is held by the colleted bottom finishing head 151'). The colleted bottom finishing head 151' primarily differs from the colletless bottom finishing head 151 by having a complete inner tube assembly 172 comprising the inner tube 170, the funnel ring 188 (optional), the spacer ring 186 (optional), and the collet 174. A colleted bottom finishing head block 161' and a colleted bottom finishing head chamber 173' are suitably modified to accommodate the differences as compared to their respective components in the colletless bottom finishing head 151.

The top finishing head 150 and colleted bottom finishing head 151' with suitable gas, electric, and mechanical connections, combine to form an inventive arc tube light source finishing stand 148' for implementing the inventive light source finishing process for any double ended light source wherein the two lead wires (e.g., first and second foliated leads 74*a*, 74*b*) are not assembled together, the primary embodiment of this being arc tubes (e.g., 318). The arc tube light source finishing stand 148' is essentially the same as the filament tube light source finishing stand 148 with the colleted bottom finishing head 151' being substituted for the colletless bottom finishing head 151. It should be apparent that the arc tube light source finishing stand 148' could also be used for finishing filament tubes (e.g., 218), as long as a way is provided for accommodating the bottom outer lead wire 83*a* of the filament assembly 104.

Referring to FIG. 10B, the end result of the second step of the inventive light source finishing process that utilizes the inventive light source body 22, filament assembly 104, and finishing heads 150 and 151 (optionally 151') is as follows. The light source body 22 is sealingly held in a way that creates a closed system of the finishing heads 150, and 151 or 151' and the inside of the body 22 for at least partial evacuation, for flushing, for filling, and for lead wire sealing by means of a variety of methods and schedules. The smoothly curved inner surfaces of the bugled ends 16*a*, 16*b* are double sealed: a first seal to the thinned edge 171 of the inner tubes 170*a*, 170*b*; and a second seal to the thinned edge 169 of the outer tubes 168*a*, 168*b*. Between the first and second seals a shroud gas (an inert gas, e.g., argon) is supplied by the shroud gas lines 152*a*, 152*b* at a slightly greater pressure relative to ambient air pressure, thereby preventing contaminating ambient air from leaking into the body 22. The filament assembly 104 (and its filament 102) is axially centered in the body 22: approximately by the collet 174, and more precisely by the straightened foils 76 in the necked-in portions 14. The collet 174, preferably working with spur(s) 80, has vertically positioned the filament assembly 104 such that the foils 76 are in position for proper sealing in the necked-in portions 14, and the filament 102 is longitudinally (vertically) centered in the bulb 18. It may be noted that even heating of the body 22 during shrink sealing is required to maintain proper centering and alignment of the body 22 and the filament assembly 104.

FIG. 10B also illustrates a third step of the inventive light source finishing process. In the third step, the light source body is prepared for filling by removing contaminated gases (e.g., moist ambient air) by means of, for example, a preferred flushing method or, alternately a pump-flush method. For example, with the needle valves 155 closed, a partial evacuation of the body 22 can be effected by opening the valve 154 of the evacuation line 153 and pumping on the evacuation line 153. Flushing is accomplished by opening the first needle valve 155*a* to allow a flushing gas to be passed through the first inlet 158*a*, into the chamber 162, through the holes 176 and/or slots 182 of the collet 174, through the body 22, and out the evacuation line 153. If a partial vacuum is drawn before flushing, then this process is a pump-flush method, whereas a continuous flushing while pumping on the evacuation line 153 is a through-flush method. As is known, heating the body 22 while flushing helps to drive out contaminants, and the flushing gas should be very dry. A variety of pump-flush and/or through-flush methods and schedules can be accommodated by the inventive light source finishing stands 148, 148'.

FIG. 10B also illustrates a fourth step of the inventive light source finishing process: filling. Once the body 22 is sufficiently flushed, the first needle valve 155*a* is closed, optionally a partial vacuum is drawn by the still-open evacuation line 153, and then the second needle valve 155*b* is opened to allow a fill gas to be passed through the second inlet 158*b*, into the chamber 162, through the holes 176 and/or slots 182 of the collet 174, and into the body 22, thereby filling the body 22 with the fill gas. Once a desired proportion of the flushing gas has been replaced by fill gas in the body 22, the body 22 is ready for sealing as illustrated in FIGS. 10C–10F. An advantageous feature of the inventive finishing head 150 is the small internal volume and small diameter of the chamber 162 plus inner tube assembly 172 plus necked-in portion 14. Especially when combined with a small volume bulb 18, the small internal volume becomes a pipeline that allows "slugs" of nearly unmixed gases to pass sequentially through, especially since the pipeline is also a small enough diameter to promote viscous flow rather than turbulent flow. Given suitable timing of the needle valves 155, it should be possible to position a slug of fill gas in the bulb 18 at the time that a first seal is effected in a bottom necked-in portion 14*b* (see FIG. 10C), thereby minimizing the amount of expensive fill gas (e.g., Xenon) needed to fill the bulb 18. The exact amount of Xenon gas needed could be measured out in an external calibrated volume (not shown) that is opened into the chamber 162.

FIG. 10C illustrates a fifth step of the inventive light source finishing process: making a first seal 210*a*. The preferred sealing method, illustrated herein, is known as "shrink sealing", although the inventive light source finishing stand 148, 148' will accommodate other methods (e.g., pinch sealing). At a time when it is determined that the body 22 has been sufficiently flushed and is being filled with the fill gas, a sealing burner 220 is applied to a bottom necked-in portion 14*b* of the body 22. For shrink sealing, the second needle valve 155*b* and/or the evacuation line valve 154 are adjusted to create a pressure within the body 22 that is near or slightly below ambient pressure, thereby assisting the shrink sealing. In FIG. 10C, a top necked-in portion 14*a* illustrates the seal area before sealing, and the bottom necked-in portion 14*b* is shown at the completion of shrinking to form the first seal 210*a*. The size, shape, intensity, heating time, etc. for the sealing burner 220 and its flames are adjusted according to known methods for shrink sealing. Likewise, the sealing burner 220 may be oscillated for suitably applying heat around the perimeter of the bottom necked-in portion 14*b*. Uniform, even heating is needed in order to maintain axial alignment of the seal 210*a* and therefore of the filament assembly 104 within. Preferably, sufficient heat is applied such that the bottom necked-in portion 14*b* will shrink around the foil 76 of a bottom foliated lead 74*b* to form a hermetic seal between the body 22 and the foil 76. Further preferably, sufficient heat is applied such that the bottom necked-in portion 14*b* will shrink around a bottom inner lead 82*b* and at least part of a bottom spud coil 111*b* to form an inner lead seal 212 for assisting to hold together the bottom spud coil 111*b* and the bottom inner lead 82*b*, and also for preventing stress at the transition from the bottom inner lead wire 82*b* to the foil 76. Further preferably, sufficient heat is applied such that the bottom necked-in portion 14*b* will shrink around a portion of the stretched-out leg 113 of the filament 104, for quenching arcs that may occur at end of life of the filament tube. Further preferably, sufficient heat is applied such that the bottom necked-in portion 14*b* will shrink around a bottom outer lead wire 83*b* to form an outer lead seal 214 for preventing stress at the transition from the bottom outer lead wire 83*b* to the foil 76, and also for defining a preferred circular cross-section for the innermost portion of a bell mouth 216 that results from shrinking the innermost end of the bottom bugled end 16*b*. As will be seen in the description of light source mounting hereinbelow with reference to FIG. 14, the bell mouth 216 does not have to be round, and furthermore can be quite shallow in depth, as long as there is room for an elbow 422 of an electrical support wire 416.

FIG. 10D illustrates a sixth and final step of the inventive light source finishing process: making a second seal 210*b* (see FIGS. 10E-10F for views of the completed seal). After completion of the first seal 210*a*, a cooling nozzle 222 begins spraying a coolant 224 (e.g., liquid nitrogen) onto at least a lower portion of the bulb 18 of the body 22 in order to "freeze" a predetermined amount of the fill gas into the bulb 18. For example, the chamber 162 can be sized such that the predetermined amount equals the slug of gas contained in the closed volume comprising the chamber 162 (with needle valves 155 closed), the inner tube 170 and the sealed-one-end body 22. By closing the second needle valve 155*b*, freezing the fill gas will cause a below-ambient pressure within the body 22, thereby assisting in the shrink seal process. The sealing burner 220 is applied to the top necked-in portion 14*a* of the body 22. In FIG. 10D, the top necked-in portion 14*a* illustrates the seal area before shrink sealing to form the second seal 210*b* (shown in FIGS. 10E–10F). The second seal 210*b* is formed by a shrink sealing process as described hereinabove for the first seal 210*a*. After forming the second seal 210*b*, the coolant 224 and the various gas and vacuum lines can be turned off (valves closed); the sealing burner 220 can be extinguished and/or removed; and the clamshells 190 can be opened and the completed light source (in this case a filament tube 218) can be removed from the light source finishing stand 148. Optionally a pilot flow of gas can be maintained in the chambers 162, 173 and in the outer tubes 168 as a means for releasing the seal to the bugled ends 16 and also as a means for preventing backflow contamination of the finishing heads 150, 151.

FIGS. 10E and 10F show two views (rotated 90° one from the other) of the filament tube 218 finished according to the invention. The first seal 210*a* and the essentially identical second seal 210*b* (collectively referred to as seals 210) are shrunk around the foils 76 of the foliated leads 74 to form hermetic seals between the body 22 and the foils 76. Preferably, the seals 210 are also shrunk around the inner leads 82 and at least part of the spud coils 111 to form inner lead seals 212 for assisting to hold each spud coil 111 together with a corresponding inner lead 82, and also for preventing stress at the transition from inner lead wire 82 to foil 76. Further preferably, sufficient heat is applied such that the inner lead seals 212 are formed around a portion of the stretched-out legs 113 of the filament 104, for quenching arcs that may occur at end of life of the filament tube 218 (i.e., quenching an arc before it can reach the more massive inner lead wire 82). Further preferably, the seals 210 are also shrunk around the outer lead wires 83 to form outer lead seals 214 for preventing stress at the transition from outer lead wire 83 to foil 76, and also for forming bell mouths 216 having a preferred circular cross-section for the innermost portion of each bell mouth 216 that results from shrinking the innermost end of each bugled end 16. As will be seen in the description of light source mounting hereinbelow with reference to FIG. 14, the bell mouth 216 does not have to be round, and furthermore can be quite shallow in depth, as long as there is room for an elbow 422 of an electrical support wire 416.

The inventive filament tube light source finishing stand 148, and arc tube light source finishing stand 148' have been described hereinabove, along with process steps for finishing a filament tube 218. With reference to FIGS. 10A–10D and FIGS. 15A–15B, the process steps for finishing an arc tube 318 will now be described. In general, only a few changes are needed to adapt the inventive finishing stand and finishing process steps for finishing arc tubes instead of filament tubes.

FIGS. 10A and 15A illustrates a first step of the arc tube light source finishing process wherein a first electrode/foliated lead assembly 302 (instead of the filament assembly 104) is loaded into the top finishing head 150 where it is suspended at a predetermined vertical position by the collet 174 as described hereinabove. Similarly, a second electrode/foliated lead assembly 304 is loaded into the colleted bottom finishing head 151'. Vertical positioning of the second electrode/foliated lead assembly 304 can be accomplished in at least two ways. If the collet 174 in the colleted bottom finishing head 151' is dimensioned to grip the bottom outer lead wire 83*a*, then vertical positioning is accomplished by the mechanism that places the second electrode/foliated lead assembly 304 into the collet 174. If it is desired to use a spur 80 hanging from the collet 174, then the arc tube light source finishing stand 148' can be inverted when vertical positioning of the second electrode/foliated lead assembly 304 is needed (e.g., during sealing about the foil 76 of the second electrode/foliated lead assembly 304).

FIG. 15A illustrates a second step of the light source finishing process wherein the first and second electrode/foliated lead assemblies 302, 304 are threaded into a light source body 22, and the light source body 22 is loaded into the top finishing head 150 and also into the colleted bottom finishing head 151'. As described hereinabove, the light source body 22 is laterally centered and axially aligned with the finishing heads 150, 151' by means of the interaction of bugled ends 16 with clamshells 190 and with inner tubes 170. The top finishing head 150 and the colleted bottom finishing head 151' are axially aligned with each other, and at least one of the two finishing heads 150, 151' is compliant in its vertical positioning in order to accommodate slight variations in overall body length L. The funnel shape of the bugled ends 16 helps to guide the first and second electrode/foliated lead assemblies 302, 304 into the body 22, further assisted by the tapered or at least rounded-off leading/trailing ends 88 of the foils 76. The first and second electrode/foliated lead assemblies 302, 304 can be further encouraged to thread into the body 22 by directing a stream of clean, dry, inert gas into and/or through the body 22 (e.g., shroud gas emitted between the inner tube 170 and outer tube 168). Also, threading of the second electrode/foliated lead assembly 304 can be assisted by inverting the arc tube light source finishing stand 148' while the body 22 is applied over the second electrode/foliated lead assembly 304.

Referring to FIG. 15A, the end result of the second step of the inventive light source finishing process that utilizes the inventive light source body 22, first and second electrode/foliated lead assemblies 302, 304, and finishing heads 150 and 151' is as follows. The light source body 22 is sealingly held in a way that creates a closed system of the finishing heads 150, 151' and the inside of the body 22 for at least partial evacuation, for flushing, for filling, and for lead wire sealing by means of a variety of methods and schedules. The smoothly curved inner surfaces of the bugled ends 16 are double sealed: a first seal to the thinned edge 171 of the inner tubes 170; and a second seal to the thinned edge 169 of the outer tubes 168. Between the first and second seals a shroud gas (an inert gas, e.g., argon) is supplied by the shroud gas lines 152 at a slightly greater pressure relative to ambient air pressure, thereby preventing contaminating ambient air from leaking into the body 22. The first and second electrode/foliated lead assemblies 302, 304 (and their corresponding first and second electrodes 306, 308) are axially centered in the body 22: approximately by the collets 174, and more precisely by the straightened foils 76 in the necked-in portions 14. The collet 174, preferably working with spur(s) 80, has vertically positioned the filament assembly 104 such that the foils 76 are in position for proper sealing in the necked-in portions 14, and the first and second electrodes 306, 308 are longitudinally (vertically) positioned at predetermined locations relative to the bulb 18 (determined by shank lengths between electrodes and foils).

FIG. 15A also illustrates a third step of the inventive arc tube light source finishing process. In the third step, the light source body is prepared for filling by removing contaminated gases (e.g., moist ambient air) by means of, for example, a preferred flushing method or, alternately a pump-flush method, as described hereinabove.

FIG. 15A also illustrates a fourth step of the inventive arc tube light source finishing process: filling. Once the body 22 is sufficiently flushed, the first needle valve 155*a* is closed, optionally a partial vacuum is drawn by the still-open evacuation line 153, and then the second needle valve 155*b* is opened to allow a fill gas to be passed through the second inlet 158*b*, into the chamber 162, through the holes 176 and/or slots 182 of the collet 174, and into the body 22, thereby filling the body 22 with the fill gas. Once a desired proportion of the flushing gas has been replaced by fill gas in the body 22, the body 22 is ready for a first seal. An advantageous feature of the inventive finishing head 150 is the small internal volume and small diameter of the chamber 162 plus inner tube assembly 172 plus necked-in portion 14. Especially when combined with a small volume bulb 18, the small internal volume becomes a pipeline that allows “slugs” of nearly unmixed gases to pass sequentially through, especially since the pipeline is also a small enough diameter to promote viscous flow rather than turbulent flow. Given suitable timing of the needle valves 155, it should be possible to position a slug of fill gas in the bulb 18 at the time that a first seal is effected in a bottom necked-in portion 14*b* (see FIG. 10C), thereby minimizing the amount of expensive fill gas (e.g., Xenon) needed to fill the bulb 18.

FIGS. 10C and 15A illustrate a fifth step of the inventive arc tube light source finishing process: making a first seal 210*a*. Although FIG. 10C adequately illustrates the act of sealing the body 22 about the foil 76, it should be apparent by comparison with FIG. 15A that an illustration of arc tube sealing can be perfected by replacing the colletless bottom finishing head 151 with the colleted bottom finishing head 151', and by replacing the filament assembly 104 with the first and second electrode assemblies 302, 304. One further change is required in the case of making the first seal 210*a* when the collet 174 in the colleted bottom finishing head 151' is dimensioned such that the second electrode assembly 304 must be hanging from a spur 80 hooked over the collet 174 in order to attain a desired vertical positioning: in this case, the arc tube light source finishing stand 148' must be inverted 180 degrees to place the colleted bottom finishing head 151' on top during the making of the first seal 210*a*. The preferred sealing method, illustrated herein, is known as “shrink sealing”, although the inventive light source finishing stand 148, 148' will accommodate other methods (e.g., pinch sealing). At a time when it is determined that the body 22 has been sufficiently flushed and is being filled with the fill gas, a sealing burner 220 is applied to a bottom necked-in portion 14*b* of the body 22. For shrink sealing, the second needle valve 155*b* and/or the evacuation line valve 154 are adjusted to create a pressure within the body 22 that is near or slightly below ambient pressure, thereby assisting the shrink sealing. In FIG. 10C, a top necked-in portion 14*a* illustrates the seal area before sealing, and the bottom necked-in portion 14*b* is shown at the completion of shrinking to form the first seal 210*a*. The size, shape, intensity, heating time, etc. for the sealing burner 220 and its flames are adjusted according to known methods for shrink sealing. Likewise, the sealing burner 220 may be oscillated for suitably applying heat around the perimeter of the bottom necked-in portion 14*b*. Uniform, even heating is needed in order to maintain axial alignment of the seal 210*a* and therefore of the electrode/foliated lead assemblies 302, 304 within. Preferably, sufficient heat is applied such that the bottom necked-in portion 14*b* will shrink around the foil 76 of a bottom foliated lead 74*b* to form a hermetic seal between the body 22 and the foil 76. Further preferably, sufficient heat is applied such that the bottom necked-in portion 14*b* will shrink around a bottom inner lead 82*b* to form an inner lead seal 212 for providing a desired bowl shape around and behind the electrode 306 or 308, and also for preventing stress at the transition from the bottom inner lead wire 82*b* to the foil 76. Further preferably, sufficient heat is applied such that the bottom necked-in portion 14*b* will shrink around a bottom outer lead wire 83*b* to form an outer lead seal 214 for preventing stress at the transition from the bottom outer lead wire 83*b* to the foil 76, and also for defining a preferred circular cross-section for the innermost portion of a bell mouth 216 that results from shrinking the innermost end of the bottom bugled end 16*b*. As will be seen in the description of light source mounting hereinbelow with reference to FIG. 14, the bell mouth 216 does not have to be round, and furthermore can be quite shallow in depth, as long as there is room for an elbow 422 of an electrical support wire 416.

FIGS. 10D and 15A illustrate a sixth and final step of the inventive arc tube light source finishing process: making a second seal 210*b* (see FIG. 15B for a view of the completed seal). Although FIG. 10D adequately illustrates the act of sealing the body 22 about the foil 76, it should be apparent by comparison with FIG. 15A that an illustration of arc tube sealing can be perfected by replacing the colletless bottom finishing head 151 with the colleted bottom finishing head 151', and by replacing the filament assembly 104 with the first and second electrode assemblies 302, 304. One further change is required in the case of making the second seal 210*b* when the collet 174 in the colleted bottom finishing head 151' is dimensioned such that the second electrode assembly 304 must be hanging from a spur 80 hooked over the collet 174 in order to attain a desired vertical positioning: in this case, the arc tube light source finishing stand 148' was inverted for the first seal 210*a*, and must now be inverted 180 degrees again to place the colleted bottom finishing head 151' back at the bottom during the making of the second seal 210*b*. After completion of the first seal 210*a*, a cooling nozzle 222 begins spraying a coolant 224 (e.g., liquid nitrogen) onto at least a lower portion of the bulb 18 of the body 22 in order to "freeze" a predetermined amount of the fill gas into the bulb 18. By closing the second needle valve 155*b*, freezing the fill gas will cause a below-ambient pressure within the body 22, thereby assisting in the shrink seal process. If desired, other solid or liquid phase arc tube light source ingredients (e.g., mercury and/or metal halide pellets) may also be dropped into the arc tube body 18 by known means (e.g., an inlet tube or passage, not shown, that opens into the inner tube 170). The sealing burner 220 is applied to the top necked-in portion 14*a* of the body 22. In FIG. 10D, the top necked-in portion 14*a* illustrates the seal area before shrink sealing to form the second seal 210*b* (shown in FIG. 15B). The second seal 210*b* is formed by a shrink sealing process as described hereinabove for the first seal 210*a*. After forming the second seal 210*b*, the coolant 224 and the various gas and vacuum lines can be turned off (valves closed); the sealing burner 220 can be extinguished and/or removed; and the clamshells 190 can be opened and the completed light source (in this case an arc tube 318) can be removed from the arc tube light source finishing stand 148'. Optionally a pilot flow of gas can be maintained in the chambers 162, 173' and in the outer tubes 168 as a means for releasing the seal to the bugled ends 16 and also as a means for preventing backflow contamination of the finishing heads 150, 151'.

FIG. 15B shows a single view of the arc tube 318 finished according to the invention. It should be apparent that another view, rotated 90°, would appear the same except for the first and second seals 210*a*, 210*b* which would be viewed edgewise to the foils 76, as shown for a filament tube 218 in the view of FIG. 10E. It should be understood that the scope of the invention includes light sources 218, 318 that have a first seal 210*a* that is rotated at a random angle relative to the second seal 210*b*. The first seal 210*a* and the essentially identical second seal 210*b* (collectively referred to as seals 210) are shrunk around the foils 76 of the first and second electrode assemblies 302, 304 to form hermetic seals between the body 22 and the foils 76. Preferably, the seals 210 are also shrunk around the inner leads 82 to form inner lead seals 212 for providing a desired bowl shape around and behind the electrode 306 or 308, and also for preventing stress at the transition from inner lead wire 82 to foil 76. Further preferably, the seals 210 are also shrunk around the outer lead wires 83 to form outer lead seals 214 for preventing stress at the transition from outer lead wire 83 to foil 76, and also for forming bell mouths 216 having a preferred circular cross-section for the innermost portion of each bell mouth 216 that results from shrinking the innermost end of each bugled end 16. As will be seen in the description of light source mounting hereinbelow with reference to FIG. 14, the bell mouth 216 does not have to be round, and furthermore can be quite shallow in depth, as long as there is room for an elbow 422 of an electrical support wire 416.

Lamp Assembly

A feature of the present invention is that the inventive light sources (e.g., filament tubes 218 and arc tubes 318) can be simply and inexpensively mounted in a variety of lamp products, of which two embodiments are provided as examples hereinbelow. Many more configurations should become evident given the teaching of the present description.

FIG. 13A shows a first of many possible exemplary embodiments of an inventive light source 450 (in this case, two filament tube light sources 218*a*, 218*b*) being mounted in a type of lamp that is a general service incandescent lamp 400. The incandescent lamp 400 has a transparent or translucent bulb/outer jacket 402 and an electrically conductive base 404 comprising an eyelet 406 and a screw-threaded shell 408. Fixed within the bulb 402 is a nonconductive stem 410 and a post 414 for supporting the two filament tube light sources 218*a*, 218*b*. A first filament tube light source 218*a* has a first outer lead wire 83*a* and an opposed second outer lead wire 83*b*, and a second filament tube light source 218*b* has a third outer lead wire 83*c* and an opposed fourth outer lead wire 83*d*. Electrical connections are provided for connecting the first and second filament tube light sources 218*a*, 218*b* in series, thereby forming a "Gemini Lamp". A first stem leadwire 412*a* (optionally including a fuse 407) is electrically and mechanically connected between the eyelet 406 and a first electrical support wire 416*a* that is nonconductively attached to the stem support post 414 (e.g., embedded in a glass bead on the post) and electrically and mechanically connected to the first outer lead wire 83*a* and to the first filament tube light source 218*a* by means of a first inventive electrical support connection 420*a* (further detailed hereinbelow with reference to FIG. 14). A connecting electrical support wire 418 provides series electrical connection between the second outer lead wire 83*b* (on the first filament tube light source 218*a*) and the third outer lead wire 83*c* (on the second filament tube light source 218*b*) by means of respective second and third electrical support connections 420*b* and 420*c*. Furthermore, the connecting electrical support wire 418 also helps provide support for the first and second filament tube light sources 218*a*, 218*b* by means of being attached to the stem support post 414 (e.g., embedded in a glass bead, or welded to a metallic stem support post 414). A second stem leadwire 412*b* is electrically and mechanically connected between the shell 408 and a second electrical support wire 416*b* that is nonconductively attached to the stem support post 414 and electrically and mechanically connected to the fourth outer lead wire 83*d* and to the second filament tube light source 218*b* by means of a fourth electrical support connection 420*d*.

Cost saving embodiments of the present invention that should be considered within its scope are envisioned wherein, for example, the stem support post 414 is eliminated and the first and second electrical support wires 416*a*, 416*b* are replaced by the first and second stem lead wires 412*a*, 412*b*, respectively, which are directly connected, electrically and mechanically, to the first and second filament tube light sources 218*a*, 218*b* by means of inventive electrical support connections 420. Known means of strengthening the first and second stem leadwires 412*a*, 412*b* and the connecting electrical support wire 418 should be adequate to support the two filament tube light sources 218*a*, 218*b* in a desired configuration under normal handling and operating conditions.

FIG. 13B shows a second example of an inventive light source 450 (in this case, an arc tube light source 318) being mounted in a type of lamp that is a sealed beam headlamp 470. The sealed beam headlamp 470 has a reflector 472 and lens 473 and a pair of ferrules 474*a*, 474*b* located at the base of the reflector 472. The ferrules 474*a*, 474*b* are respectively connected to a pair of electrical terminals 478*a*, 478*b*. The arc tube light source 318 is both supported and electrically connected across the pair of ferrules 474*a*, 474*b* by first 482*a* and second 482*b* electrical support wires that are electrically and mechanically connected to first and second outer lead wires 83*a* and 83*b*, respectively. A first ferrule 474*a* is electrically and mechanically connected (e.g., by brazing) to the first electrical support wire 482*a*, which is in turn electrically and mechanically connected to the first outer lead wire 83*a* and to the arc tube light source 318 by means of a first inventive electrical support connection 420*a*. Similarly, a second ferrule 474*b* is electrically and mechanically connected to the second electrical support wire 482*b*, which is in turn electrically and mechanically connected to the second outer lead wire 83*b* and to the arc tube light source 318 by means of a second inventive electrical support connection 420*b*. It may be noted that the electrical support wires 416, 418, 482 can have any desired cross-section, e.g., round, square, ribbon, etc.

Another feature of the present invention is an electrical support connection 420 (e.g., first, second, third, and fourth electrical support connections 420*a*, 420*b*, 420*c*, and 420*d*, respectively) that is enhanced by the flared-out bell mouth 216 and/or bugled end 16 on each end of the inventive light sources 218, 318 (e.g., filament tube light source 218 shown). FIG. 14 shows a representative bell mouth 216 and bugled end 16 formed around an outer lead wire 83 that extends from an end of a light source 218. The bugled end 16 comprises an outward-opening cavity about the outer lead wire 83, and the cavity is optionally deepened as desired by the bell mouth 216. The electrical support connection 420 comprises an elbow 422 formed in an electrical support wire 416, 482 (e.g., 416 shown) such that the elbow 422 loops into the bugled end 16 of the bell mouth 216. The elbow 422 thus hooks the bugled end 16, thereby mechanically securing the light source 218, 318 given a holding force Fh that presses the elbow 422 into the bugled end 16. The holding force Fh may be provided by attaching the elbow 422 to the outer lead wire 83 (e.g., by welding), in which case the electrical support wire 416, 482 can end after the point of attachment (not shown). Preferably, the electrical support wire 416, 482 is formed in a loop 424 (e.g., the electrical support wire 416, 482 extends beyond the elbow 422 outward of the bugled end 16 and into a reverse-bent leg having a connection 426 (e.g., a crimped hook) that mechanically and preferably also electrically connects (provides an attachment of) the electrical support wire 416, 482 to the outer lead wire 83. Preferably the holding force Fh is applied to the loop 424 while the connection 426 is being made, thereby placing the outer lead wire 83 in tension for maintaining the holding force Fh and thereby assuring a secured light source 218, 318. Even without any significant magnitude of holding force Fh, simply hooking the elbow 422 within the bugled end 16 while connecting the electrical support wire 416, 482 to the outer lead wire 83 will provide a desirable stiffening of support for the light source 218, 318 as compared to the prior art. A further advantage of the inventive electrical support connection 420 is that it supports the light source (e.g., 218) by applying essentially lateral stresses on the relatively strong bugled end 16 but not on the outer lead wire 83, which only sees mostly longitudinal tensile stress. This is good because the wire-to-light source seal is relatively strong in tension but is subject to failure under lateral forces that tend to bend the outer lead wire 83. It may be noted that the inventive electrical support connection 420 can be employed for mechanically supporting a light source (e.g., 218) while other means are used for electrically connecting the light source (e.g., 218).

Gemini Lamp

The incandescent lamp 400 illustrated in FIG. 13A is a preferred embodiment of a "Gemini Lamp", wherein the incandescent light source 450 within the outer jacket 402 comprises two halogen filament tubes 218*a*, 218*b* that are electrically connected in series, preferably with the filament tubes 218 mounted in a crossed configuration as shown (preferably crossing at an approximately 90° angle), thereby minimizing the amount of light from one filament tube (e.g., 218*a*) that is blocked by the other (e.g., 218*b*). Also preferably the outer jacket 402 is an inexpensive standard bulb of thin common glass (e.g., soda-lime glass with an average wall thickness of about 0.020"). Further preferably the outer jacket 402 is filled with an inexpensive dry inert gas (e.g., Nitrogen), or evacuated.

There are many consumer advantages provided by the Gemini Lamp 400, and utilization of various inventive features disclosed herein are intended to significantly cost-reduce the Gemini Lamp 400 by providing means for mass production of inexpensive filament tubes 218 and means for their mounting in an outer jacket 402, thereby placing double-filament-tube general service lamps within a price range acceptable to household consumers. One of many advantages is a lamp efficacy improvement that is provided by the stretched-out leg 113 on either end of the coiled-coil filament 102. The stretched-out leg 113 design is more efficient than conventional coiled-coil filaments having single coil legs that consume some electrical power without producing any appreciable light. In general, the Gemini lamp utilizes every scrap of advantage to yield, in toto, a much more overall advantageous design.

Significant safety advantages result from the inventive design. The Gemini lamp is a combination of two halogen lamps (e.g., filament tubes 218) in series, each one operating at half of the line voltage, and at half of the total lamp wattage. At the end of life in a halogen lamp, filament burnout generally produces a break in the cooler running end of the filament where failure occurs because of "notching". An arc can start, jumping the break in the filament, and then quickly spreading to an arc across the whole length of the filament, thereby heating the fill gas to high temperatures, enough to potentially explode the filament tube 218. The Gemini Lamp 400 has only half of the line voltage across each filament tube 218, thereby decreasing the likelihood of arcing in the first place, and if it occurs anyway (e.g., in a first filament tube 218*a*), the still-burning series-connected second filament tube 218*b* will act like an arc tube ballast and will limit the arc current to a harmless level such that the arc cannot heat the fill gas enough to explode the failed first filament tube 218*a*. Further protection is provided by the stretched-out leg 113 of the filament 102 (see FIGS. 9B and 10F) that is positioned at the cooler ends of the filament 102 where the break generally occurs. Since the stretched-out leg 113 has very little mass, it burns back during arcing at a very high speed, and is lost to the arc when it burns into the inner lead seal 212. Decomposition products of vaporized quartz provide a cooling effect that tends to snuff out the arc as the wire of the filament leg 113 melts back into the quartz of the inner lead seal 212. This quenching of the arc appears to occur even faster than a fuse wire can melt in response to the arc. (Fuse wires are typically incorporated into one or both of the leadwires 412 where they pass through the base 404.) Even further protection is provided by using a filament tube body 22 having a very small diameter D1 of a circular cross-section, especially in the shrink sealed inner lead seal 212, all of which combine to provide an extraordinarily high burst strength. Side by side testing was conducted to compare failure mode of 100 W, 120V Gemini Lamps 400 (with two series connected 50 W, 60V halogen filament tubes 218*a*, 218*b*) versus lamps having the same outer jacket 402 but containing only one standard halogen filament tube (e.g., 1100) of the same total lamp operating voltage (120V) and wattage (100 W). Failure was provoked by ramping up the lamp's line voltage until the tested lamp arced out. The conventional lamps 1170 all failed violently, wherein the arc exploded the quartz body (e.g., 1010). In contrast, the Gemini Lamps 400 all failed passively, wherein one of the two filament tubes 218 arced out, but did not explode.

The inventive lamp 400 provides significant cost savings when compared to prior art lamps (e.g., 1170 in FIG. 1B). Gemini Lamp 400 components are fewer and cost less than components of comparable same-wattage quartz-halogen lamps. For example, the light source bulb 22 requires very little expensive quartz material, while the two filaments 104 combine to use almost the same length of tungsten wire of the same diameter, if not less length (due to the use of a more energy-efficient stretched-out leg 113 on a coiled coil filament 102). For example, the one piece foliated lead 74 efficiently uses a shorter length of smaller diameter molybdenum wire 42 and doesn't need foil that is inefficiently welded together in common three-part foliated leads. For example, the small volume light source body 22 uses less of an expensive fill gas (e.g., Xenon), lesser still when the inventive finishing stand 148 and light source finishing process are employed. For example, the foliated leads 74 and the light source bodies 22 are efficiently mass-produced with virtually no waste. For example, expensive quartz cutoff saws are not needed to produce the bodies 22. For example, because of the safe failure mode of the Gemini Lamp 400, an inexpensive common outer jacket 402 can be used instead of "coke-bottle" enclosures with wall thicknesses approaching 0.250". For example, the stiffness of the stretched-out legs 113 and the shorter filament 104 (due to half the voltage and half the wattage) effectively shortens the unsupported span of the filament and reduces its sag and twisting, such that a smaller body diameter D1 can be employed, thereby reducing its cost. The half wattage filament also allows a smaller diameter body than a full wattage filament for the further reason that heat loading on the body is cut in half for the half wattage filament.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A process for manufacturing one-piece foliated leads for sealing in electrical light sources from conductive wire, each such foliated lead comprising a foil bookended by a first lead wire and a second lead wire, the process comprising the steps of:

providing two opposed automated hammers, each having a working face centered on an axis;

aligning the working faces of the two hammers to be centered on a common axis;

positioning a portion of wire between the working faces and orthogonally crossing through the common axis;

foliating the wire by hammering the wire between the working faces of said hammers with a predetermined plurality of blows in rapid succession, each blow having a predetermined magnitude of hammering energy, wherein the motion of hammering is along the common axis; and significantly increasing the magnitude of hammering energy for each succeeding blow of the plurality of blows, such that the magnitude of hammering energy of a second blow is significantly higher than that of a first blow of the plurality of blows, the magnitude of hammering energy of a third blow is significantly higher than that of the second blow of the plurality of blows, and so on such that the magnitude of hammering energy of the last blow is significantly higher than that of the next-to-last blow of the plurality of blows.

2. The process of claim 1, wherein:

the magnitude of hammering energy is increased at least linearly for each succeeding blow.

3. The process of claim 1, further comprising the steps of:

tensioning the portion of wire during the foliating step; and keeping the hammers centered on a foliated portion of the wire during the foliating step.

4. The process of claim 1, further comprising the steps of:

supplying a continuous length of wire;

conducting the process in sequential cycles, each cycle comprising a step of advancing the wire, followed by a step of processing portions of the wire simultaneously in each of a plurality of stages of the process;

advancing the wire by a step distance selected to produce a uniform predetermined foil spacing along the continuous length of wire that is a foliated wire after a hammering stage being the process of claim 1; and providing a cutting stage for cutting the foliated leads off an end of the foliated wire.

5. The process of claim 4, further comprising the step of:

after the hammering stage, providing a straightening stage comprising the step of:

pulling longitudinally on the first lead wire and the second lead wire in order to tension the foil therebetween such that lateral edges of the foil are curled around a longitudinal line.

6. The process of claim 5, further comprising the step of:

heating the foil during the straightening stage.

7. The process of claim 6, further comprising the step of:

using an oxidizing heat source such that etching of the foil is included in the heating step.

8. The process of claim 5, further comprising the step of:

between the straightening stage and the cutting stage, providing a foil etching stage for etching the foil.

9. The process of claim 4, further comprising the step of:

before the cutting stage, providing a foil etching stage for etching the foil.

10. The process of claim 9, wherein the foil etching stage further comprises the steps of:

firstly passing the foliated wire through electroetching fluid contained in a first etching bath that also contains a first electrode connected to a first pole of an AC power supply; and secondly passing the foliated wire through electroetching fluid contained in a second etching bath that also contains a second electrode connected to a second pole, opposite to the first pole, of the AC power supply.

11. The process of claim 10, further comprising the step of:

passing the foliated wire through the first etching bath and through the second etching bath by passing through a plurality of seals below a fluid level of the electroetching fluid such that each one of the plurality of seals allows passage of the foliated wire while limiting fluid loss leaking out.

12. The process of claim 4, wherein the cutting stage further comprises the step of:

forming cut ends each having at least one spur protruding laterally beyond a perimeter of the wire.

13. The process of claim 12, wherein the cutting stage further comprises the step of:

cutting the wire with a blunt cutting blade.

14. The process of claim 12, wherein the cutting stage further comprises the step of:

forming at least every other cut end at an angle to the wire of about 45 degrees to about 75 degrees; such that a single spur protrudes laterally beyond the perimeter of the wire.

15. The process of claim 4, wherein the cutting stage comprises:

opposed cuffing blade edges aligned in a central plane of a cutter, each blade edge being defined at a vertex of blade sides that form a blade angle in the range of about 60 degrees to about 120 degrees wherein the blade angle is approximately halved by the central plane;

and wherein the step of cuffing the foliated leads comprises:

moving the opposed cuffing blade edges together within the central plane.

16. The process of claim 1, wherein:

the working face of each of the opposed hammers is provided on a frustum and has a slightly convex surface centered on the working face axis.

* * * * *